US008605257B2

(12) United States Patent
Scheible et al.

(10) Patent No.: US 8,605,257 B2
(45) Date of Patent: Dec. 10, 2013

(54) PROJECTION SYSTEM WITH COMPENSATION OF INTENSITY VARIATIONS AND COMPENSATION ELEMENT THEREFOR

(75) Inventors: Patrick Scheible, Aalen (DE); Guenter Scheible, legal representative, Stuttgart (DE); Sigrid Scheible, legal representative, Stuttgart (DE); Alexandra Pazidis, Aalen (DE); Reiner Garreis, Aalen (DE); Michael Totzeck, Schwaebisch Gmuend (DE); Heiko Feldmann, Schwaebisch Gmuend (DE); Paul Graeupner, Aalen (DE); Hans-Juergen Rostalski, Oberkochen (DE); Wolfgang Singer, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 861 days.

(21) Appl. No.: 11/628,356
(22) PCT Filed: Jun. 3, 2005
(86) PCT No.: PCT/EP2005/005979
§ 371 (c)(1), (2), (4) Date: Sep. 25, 2007
(87) PCT Pub. No.: WO2005/119369
PCT Pub. Date: Dec. 15, 2005

(65) Prior Publication Data
US 2008/0094599 A1  Apr. 24, 2008

Related U.S. Application Data

(60) Provisional application No. 60/576,808, filed on Jun. 4, 2004, provisional application No. 60/633,258, filed on Dec. 3, 2004.

(51) Int. Cl.
G03B 27/72 (2006.01)
G03B 27/68 (2006.01)

(52) U.S. Cl.
USPC ............................................. 355/71; 355/52

(58) Field of Classification Search
USPC ................................. 355/35, 43, 53, 67, 71, 52
See application file for complete search history.

(56) References Cited

U.S. PATENT DOCUMENTS

| 4,346,164 A | 8/1982 | Tabarelli et al. |
| 5,222,112 A | 6/1993 | Terasawa et al. |

(Continued)

FOREIGN PATENT DOCUMENTS

| DE | 102 37 430 A1 | 4/2003 |
| DE | 102 18 989 A1 | 11/2003 |

(Continued)

OTHER PUBLICATIONS

D.L. Windt, "Multilayer Facilities Required for Extreme-Ultraviolet Lithography", J. Vac. Sci. Technology B12(6), Nov./Dec. 1994, American Vacuum Society, pp. 3826-3832.

(Continued)

*Primary Examiner* — Peter B Kim
*Assistant Examiner* — Deoram Persaud
(74) *Attorney, Agent, or Firm* — Sughrue Mion, PLLC

(57) ABSTRACT

In a projection objective for imaging a pattern arranged in the object plane of the projection objective into the image plane of the projection objective, at least one optical component is provided which has a substrate in which at least one substrate surface is covered with an interference layer system having a great spatial modulation of the reflectance and/or of the transmittance over a usable cross section of the optical component, the modulation being adapted to a spatial transmission distribution of the remaining components of the projection objective in such a way that an intensity distribution of the radiation that is measured in a pupil surface has a substantially reduced spatial modulation in comparison with a projection objective without the interference layer system.

45 Claims, 10 Drawing Sheets

(56) References Cited

U.S. PATENT DOCUMENTS

| | | | |
|---|---|---|---|
| 5,333,166 A | | 7/1994 | Seligson et al. |
| 5,715,039 A | | 2/1998 | Fukuda et al. |
| 6,243,203 B1 | * | 6/2001 | Schleipen et al. ............ 359/581 |
| 6,525,806 B1 | * | 2/2003 | Smith ............................. 355/71 |
| 6,863,398 B2 | | 3/2005 | Bauer et al. |
| 2002/0089758 A1 | * | 7/2002 | Hori ............................. 359/642 |
| 2003/0082298 A1 | | 5/2003 | Bauer et al. |
| 2003/0086158 A1 | | 5/2003 | McClay et al. |
| 2003/0099034 A1 | | 5/2003 | Mann et al. |
| 2003/0112421 A1 | | 6/2003 | Smith |
| 2003/0174301 A1 | * | 9/2003 | Imanishi ........................ 355/55 |
| 2004/0075895 A1 | * | 4/2004 | Lin ............................... 359/380 |
| 2005/0002004 A1 | * | 1/2005 | Kolesnychenko et al. ...... 355/30 |
| 2005/0270505 A1 | * | 12/2005 | Smith ............................. 355/53 |
| 2006/0052709 A1 | | 3/2006 | DeBaryshe et al. |

FOREIGN PATENT DOCUMENTS

| | | |
|---|---|---|
| EP | 1 291 680 A2 | 3/2003 |
| JP | 2001508340 A | 6/2001 |
| JP | 2004335746 A | 11/2004 |
| WO | WO 01/02907 A1 | 1/2001 |
| WO | WO 02/077692 A1 | 10/2002 |
| WO | WO 03/092256 A2 | 11/2003 |
| WO | 2004019128 A3 | 3/2004 |
| WO | WO 2005/699078 A1 | 7/2005 |

OTHER PUBLICATIONS

D.L. Windt, "Multilayer Facilities Required for Extreme-Ultraviolet Lithography", J. Vac. Sci. Technol. B, vol. 12, No. 6, Dec. 1994, pp. 3826-3832.

* cited by examiner (a)    (b)

PROJECTION SYSTEM WITH COMPENSATION OF INTENSITY VARIATIONS AND COMPENSATION ELEMENT THEREFOR

This is a National Stage Application of International Application No. PCT/EP05/005979, filed Jun. 3, 2005, and claims the benefit of U.S. Provisional 60/576,808, filed Jun. 4, 2004, and of U.S. Provisional 60/633,258, filed Dec. 3, 2004.

BACKGROUND OF THE INVENTION

1. Field of the Invention

The invention relates generally to projection systems with compensation of intensity variations and compensation elements therefor.

The invention also relates to a projection objective for imaging a pattern arranged in the object plane of the projection objective into the image plane of the projection objective, and to an optical component having a substrate in which at least one substrate surface is covered with an interference layer system. The optical component may be provided in particular for incorporation into a catadioptric or dioptric projection objective or be incorporated into the latter.

The invention also concerns a projection exposure apparatus, in particular for immersion lithography, such as is specified in the US patent applications bearing the official identification 60/592,208, 60/530,978, 60/591,775 or 60/612,823, which were not published before the priority date. The immersion medium therein is a liquid, preferably water.

The invention additionally concerns a projection exposure apparatus, in particular for near field lithography—synonymously SIL lithography (solid immersion lens)—such as is specified for example in the application document US 2003/174301 A1.

2. Description of the Related Art

Projection exposure apparatuses for microlithography are used for fabricating semiconductor components and other finely patterned devices. They serve for projecting patterns from photomasks or reticles, referred to hereinafter generally as masks or reticles, onto an object coated with a radiation-sensitive layer, for example onto a semiconductor wafer coated with photoresist, with very high resolution on a demagnifying scale.

In the process for photolithographically patterning semiconductor components, it is of crucial importance that all structure directions, in particular horizontal and vertical structures, be imaged with essentially the same imaging quality. The imaging quality of lithography objectives is determined not only by the correction state of the aberrations, but also by the profile of the intensity over the field and over the pupil of each field point. The profiles in field and pupil are intended to be as uniform as possible. Local intensity modulations in the image plane are to be avoided inter alia because the binary resist materials that are customary nowadays have a strongly nonlinear characteristic curve of sensitivity which, to a first approximation, can be modeled by the fact that an exposure takes place above an intensity threshold, while no exposure takes place below the intensity threshold. As a result, the spatial intensity profile directly influences the width of the structures produced on the semiconductor component. The more uniform the linewidth over the field and over different structure directions, the higher may be the clock frequency when using the finished semiconductor component and correspondingly the performance and the price of the finished semiconductor component. Therefore, the variation of the critical dimensions (CD variation) is an important quality criterion.

The variation of the critical dimensions may have different, alternatively or cumulatively effective causes. Especially in systems that operate with polarized light, reflectivity or transmission properties of interference layer systems that are dependent on the angle of incidence may lead to nonuniformities of the intensity over field and pupil. This problem area may occur in the case of purely refractive (dioptric) imaging systems. The abovementioned causes may occur particularly in catadioptric projection objectives, that is to say in those systems in which refractive and reflective components, in particular lenses and imaging mirrors, are combined. When utilizing imaging mirror surfaces, it is advantageous to use beam splitters if an imaging that is free of obscuration and free of vignetting is to be achieved. Systems with geometrical beam splitting and also systems with physical beam splitting, for example with polarization beam splitting, are possible. The use of mirror surfaces in such projection objectives may contribute to CD variations arising during imaging.

When using synthetic quartz glass and fluoride crystals, such as calcium fluoride, it must furthermore be taken into consideration that these materials are birefringent. They may bring about polarization-altering effects on account of induced and/or intrinsic birefringence on the light passing through, which effects likewise contribute to CD variations arising. Finally, material defects, e.g. scattering centers or striations in transparent components, may also lead to non-uniformities of the intensity distribution.

Also, absorbent optical elements, in particular immersion media, in particular immersion liquids, solid immersion lenses (SIL) or other, refractive optical materials having a high refractive index, lead to a field- and pupil-dependent transmission distribution and thus to an error in the transmission profile.

International patent application PCT/EP2004/001779 filed by the applicant on Feb. 24, 2004 and claiming priority from German patent application DE 102004002634.3 filed on Jan. 19, 2004 by the applicant discloses a microlithographic exposure apparatus designed for immersion lithography where the projection objective includes a transmission filter which is designed and arranged in the projection objective in such a way that rays which enter an immersion interspace formed between the last optical element on the image side and the image plane of the projection objective and filled with an immersion liquid from the last optical element on the image side at an angle of incidence are attenuated more strongly the smaller the angle of incidence is. The complete disclosure of that PCT application is incorporated into the present application by reference.

As the period over which the projection exposure apparatus is used increases, said transmission distributions vary on account of an alteration of the transmission behavior of the element. This requires maintenance of the projection exposure apparatus.

It is known that the transmission behavior of optical systems can be altered by means of a pupil filtering or apodization, interventions being possible both on the intensity distribution of the radiation passing through and on the phase angle of the radiation. The U.S. Pat. No. 5,222,112 describes a projection system for extreme ultraviolet light (EUV) that operates exclusively with mirror components, in the case of which degradation of the imaging performance may occur on account of different reflectances for s- and p-polarized light on multiply coated mirrors. A convex mirror arranged in the region of a pupil surface of the projection objective has a rotationally symmetrical reflectivity distribution with reflectivity that decreases to the edge of the mirror in order to improve the imaging properties of the system. A transmission filter that is transmissive for soft x-rays, with a corresponding, rotationally symmetrical transmission function, is mentioned as an alternative. A number of possibilities are mentioned for producing a mirror with a sufficiently great spatial modulation of the reflectance. One possibility consists in designing the reflective, multilayer interference layer system in such a way that the layer thicknesses of the individual layers increase or decrease continuously from the center to the edge (graded thickness multilayer). Other possibilities discussed include altering the number of layer pairs in the multilayer coating, ion implantation after the fabrication of the multilayer coating, or the production of an absorber layer with a suitable distribution of the layer thickness on the multilayer coating. The mirror arranged in the region of a pupil surface in any event acts as a spatial frequency filter. No detailed information is given on the construction of the reflection coating.

The international patent application WO 02/077692 A1 presents a method for producing optical systems which is intended to make it possible for example to provide projection objectives with extremely small wavefront aberrations even if the lenses have to a greater or lesser extent inhomogeneities of the refractive index or defects of form. The method comprises a measuring step, in which the refractive index distribution of an optical material used for producing a lens is measured, and a surface measuring step, in which the surface form of a lens is determined. An optical error or a wavefront error of the lens is determined on the basis of the measurement results. On the basis of the calculation results, an optical coating is produced on the lens, said optical coating having a predetermined thickness distribution which is suitable for minimizing the wavefront error. The coating is thus designed for establishing a phase that is as homogeneous as possible at the coated optical component.

SUMMARY OF THE INVENTION

It is one object of the invention to provide a projection system which permits an imaging essentially without or with only little variation of the critical dimensions.

It is another object of the invention to provide an optical component which is coated with an interference layer system and which can be utilized in a projection objective as a correction element for obtaining a largely uniform intensity distribution during imaging.

It is another object of the invention to provide a projection exposure system using the advantages of immersion lithography without having to accept significant losses in contrast.

It is another object of the invention to provide a projection exposure system to provide means to ensure long-term stability of the imaging quality of immersion systems.

These and other objects are achieved by projection objectives, projection exposure apparatus, optical elements and methods according to the independent claims.

Advantageous developments are specified in the dependent claims. The wording of all the claims is made the content of the description by reference.

A projection objective according to one aspect of the invention for imaging a pattern arranged in the object plane of the projection objective into the image plane of the projection objective has a multiplicity of optical components between the object plane and the image plane. At least one of the optical components has a substrate in which at least one substrate surface is covered with an interference layer system which has a great spatial modulation of the reflectance and/or of the transmittance over a usable cross section of the optical components, the modulation being adapted to a spatial transmission distribution of the remaining components of the projection objective in such a way that an intensity distribution of the radiation that is present in a pupil surface has a substantially reduced, spatial modulation in comparison with a projection objective without the interference layer system.

The optical component having a substrate in which at least one substrate surface is covered with an interference layer system which has a great spatial modulation of the reflectance and/or of the transmittance over a usable cross section of the optical component is effective as correction element for correcting the error in the transmission profile which is caused by a net intensity contrast caused by one or more sources in the projection objective. The net intensity contrast may be greater than 3% pupil effect or field effect.

Consequently, one aspect of the invention is a compensation of location-dependent intensity fluctuations in the region of the pupil surface with the aid of an interference layer system whose optical efficiency is spatially modulated over the useful area to an extent that is substantially greater than an unavoidable modulation of the optical properties that results on account of manufacturing tolerances. In particular, it is thus proposed to "impair" the effect of at least one interference layer system within the projection objective at suitable locations or regions in a targeted manner. In this case, the interference layer system may optionally be formed as a reflective system (mirror layer) or as a reflection-reducing system (antireflection) coating. For conventional interference layer systems of this type, the requirements normally consist in obtaining an as far as possible uniform efficiency (reflectance and/or transmittance) over the entire usable surface. In this case, deviations from a uniform effect are unavoidable in the context of the manufacturing tolerances and are often fractions or a few percentage points in relation to the absolute reflectance or transmittance. In contrast thereto, the effect of an interference layer system in accordance with the invention is impaired in a targeted manner at selected locations to such a great extent that, by way of example, at least one poorly reflective region is present on a mirror surface or at least one only weakly reflection-reducing region is present on an anti reflection coating.

Such an interference layer system can be utilized for compensation of intensity fluctuations by arranging it at a suitable location in the optical system such that a spatial unequal distribution of the impinging intensity is made more uniform by the effect of the interference layer system. By way of example, if an impinging radiation bundle has a nonuniform spatial intensity distribution with regions of particularly high intensity, then it is possible, for example, to arrange a mirror layer such that the regions of elevated radiation intensity impinge on regions with significantly poorer reflectance in order in this way to make the intensity distribution more uniform in the reflected light bundle. A corresponding effect can be achieved by means of an antireflection layer system in which, in regions of particularly high impinging light intensity, the reflection-reducing effect is reduced in comparison with adjacent regions to such an extent that more intensity is reflected in comparison with the adjacent region, as a result of which the intensity distribution of the radiation passing through the optical component can be made more uniform.

If the interference layer system is reflection coating, then the modulation magnitude of the reflectance may preferably be more than approximately 3%, in particular between approximately 5% and approximately 20%, of the maximum reflectance of the interference layer system. In this way, it is possible, by way of example, to produce highly reflective layer systems (HR layers) in which the reflectance varies over the effective surface for a given angle of incidence by a plurality of percentage points, for example by approximately 2, 4, 6, 8 or 10 percentage points or more.

If the interference layer system is an antireflection coating, the modulation magnitude may preferably amount to more than 50%, in particular more than 100% to 500%, of the minimum reflectance for a predetermined angle of incidence. In particular, the modulation magnitude may be so large that the reflectance of the interference layer system in at least one region of the surface amounts to more than approximately 50%, in particular more than 100%, of the reflectance of the uncovered substrate. As is known, this residual reflectance is in the region of approximately 4% in the case of many transparent materials used in lithography objectives, while "good" antireflection coatings often enable a residual reflectance of 1% or less.

The spatial distribution of the regions having a better and poorer reflection or transmission effect can be adapted to the spatial intensity distribution of the impinging radiation in any suitable manner in order to achieve the desired compensation effect. In this case, the modulation of the transmittance and/or reflectance may be for example rotationally symmetrical with respect to an optical axis of the optical component. It is also possible for the reflectance and/or transmittance of the interference layer system to have an azimuthal modulation with regard to the optical axis, in particular a radially symmetrical modulation with 2-, 3-, 4- or 6-fold symmetry. Such embodiments may be particularly useful in order to compensate for intensity modulations that result on account of intrinsic birefringence of crystal materials with specific crystal directions. It is also possible for an interference layer system to have a nonsymmetrical spatial modulation of its optical effect, for example a profile with a continuously rising or falling transmittance and/or reflectance in the transverse direction with respect to the optical axis or an arbitrary other distribution of regions of impaired efficiency.

In order to obtain a compensation effect that is as exact as possible, it is necessary to produce the local profile of the reflectance or transmittance of an interference layer system with only small deviations from a desired profile. This is achieved, in accordance with one development by virtue of the fact that the interference layer system has a plurality of individual layers lying one above the other and comprising dielectric material alternately having a high refractive index and a low refractive index and an outer layer adjoining the surroundings has a local layer thickness distribution with a great modulation of the layer thickness. By contrast, the underlying layers may have a layer thickness that is uniform in the context of the manufacturing tolerances. The layer thickness of the outermost layer may, if appropriate, vary to such a great extent that the minimum layer thickness is less than 90%, 80%, 60%, 40% or 20% of the maximum layer thickness. It has been found that as a result of this, both in the case of reflection coatings and in the case of antireflection coatings, it is possible to obtain a great modulation of the reflectance or transmittance with high absolute accuracy of the locally desired efficiency. The layer thickness of the outermost layer may, if appropriate, fall to zero in regions.

The outer layer may comprise a material having a high refractive index. Such designs are customary primarily for reflection coatings. It is also possible for the outermost layer to comprise a material having a low refractive index. This is often the case with antireflection coatings. In some embodiments, at least the outermost layer is dimensioned as a quarter-wave layer ($\lambda/4$ layer). The term quarter-wave layer in this case denotes those layers in which the product of refractive index n of the layer material and the geometrical layer thickness d corresponds to a value $\lambda/4\pm10\%$, where $\lambda$ is the operating wavelength of the system. A plurality or all of the individual layers of the interference layer system may be formed as quarter-wave layers.

The spatial modulation of the efficiency of the interference layer system can be produced in different ways. One variant involves carrying out an irradiation of a finished interference layer system with a high-energy radiation, in particular with an ion beam, in accordance with a predetermined spatial distribution, in order to produce a layer structure that is changed by the irradiation. In this case, the ion beam may be guided in computer-numerically controlled fashion, for example, over the surface to be processed and the processing intensity may be set by means of the duration for which it stays at different locations on the surface. In this case, the layer structure may be changed in such a way as to produce for example the desired layer thickness distribution of the outermost layer with great layer thickness variation. As an alternative or in addition, the absorptivity of the layer can be increased by means of the irradiation, which can be utilized for reducing the transmission of an antireflection coating or for reducing the reflectance of a reflection coating. Consequently, a local removal and/or alteration of layer material, in particular of the outermost layer, can be utilized for producing a layer thickness variation.

The desired spatial distribution of the layer properties can also be achieved by the fact that layer thickness variations of the individual layers to be applied are produced in a targeted manner during the coating process. Diaphragm methods known per se can be utilized for this purpose, in the case of which parts of the substrate surface are shaded occasionally by shading diaphragms during a coating process between a material source and the substrates to be coated, in order to achieve a desired layer thickness profile and/or particular layer properties. Diaphragm methods for influencing the properties of optical coatings are described for example in the applicant's German patent application DE 102 37 430.9 and also in the documents cited therein. Special diaphragm methods for producing different nonrotationally symmetrical layer thickness profiles are explained in more detail in the embodiments.

The invention also relates to a method for producing an optical component having a substrate in which at least one substrate surface is covered with an interference layer system having a great spatial modulation of a reflectance and/or of a transmittance with a high modulation magnitude over a usable cross section of the optical component. The method comprises in particular producing an outermost layer of the interference layer system with a spatial layer thickness distribution with a great modulation of the layer thickness, in which case the minimum layer thickness may be preferably less than 80% or 60% or 40% or 20% of the maximum layer thickness. The underlying layers may have essentially uniform layer thicknesses. One method variant involves firstly applying the outer layer with the maximum layer thickness provided, and subsequently producing a desired layer thickness distribution of the outermost layer, which leads to a desired spatial modulation of the reflectance and/or transmittance, by local removal of layer material, for example by ion beam etching (sputtering).

Optical components in accordance with the invention may be utilized in various optical systems. A preferred field of application is high-performance imaging systems, in particular projection objectives for microlithography. Use in catadioptric projection objectives is particularly advantageous, that is to say those projection objectives which have at least one catadioptric objective part comprising a concave mirror and an assigned beam deflection device, which is provided for directing the radiation coming from an object plane of the projection objective in the direction of the concave mirror and/or for deflecting the radiation reflected from the concave mirror in the direction of downstream objective parts. It is often favorable to arrange at least one further objective part behind and/or in front of a catadioptric objective part, which further objective part is preferably constructed purely refractively (dioptrically). The invention can also be utilized in the case of purely refractive projection objectives or within purely refractive partial objectives of a larger imaging system. The invention can be utilized in the case of projection objectives with at least one real intermediate image and equally in the case of projection objectives in which the object field is imaged into an image field directly, i.e. without an intermediate image.

The above mentioned error in the transmission profile, e.g. caused by absorbent material such as an immersion liquid, can be determined as a net intensity contrast of the optical element. This has a pupil effect and a field effect.

The projection exposure apparatus according to one aspect of the invention is provided with a correction element, in particular with filters that influence the transmission. Said correction element corrects the field- and pupil-dependent transmission distribution caused by the immersion medium. In this case, it is advantageous to determine a parameter, in particular the transmission index $\alpha$, which substantially influences the transmission behavior of the optical element.

If the correction element introduces aberrations into the projection exposure apparatus, in particular into the projection objective, then these can be at least partially corrected by means of a second correction element.

The above procedure is also suitable for maintenance work on projection exposure apparatuses whose transmission distributions have changed on account of alterations of the immersion medium. In this case, preferably the upper parameter, especially the transmission index $\alpha$, is determined anew. This new determination is performed in particular by simulation or measurement.

The above and further features emerge not only from the claims but also from the description and from the drawings. In this case, the individual features may be realized, and may represent embodiments which are advantageous and which are protectable per se, in each case on their own or as a plurality in the form of subcombinations in an embodiment of the invention and in other fields.

DETAILED DESCRIPTION OF THE PREFERRED EMBODIMENTS

Figure 1:
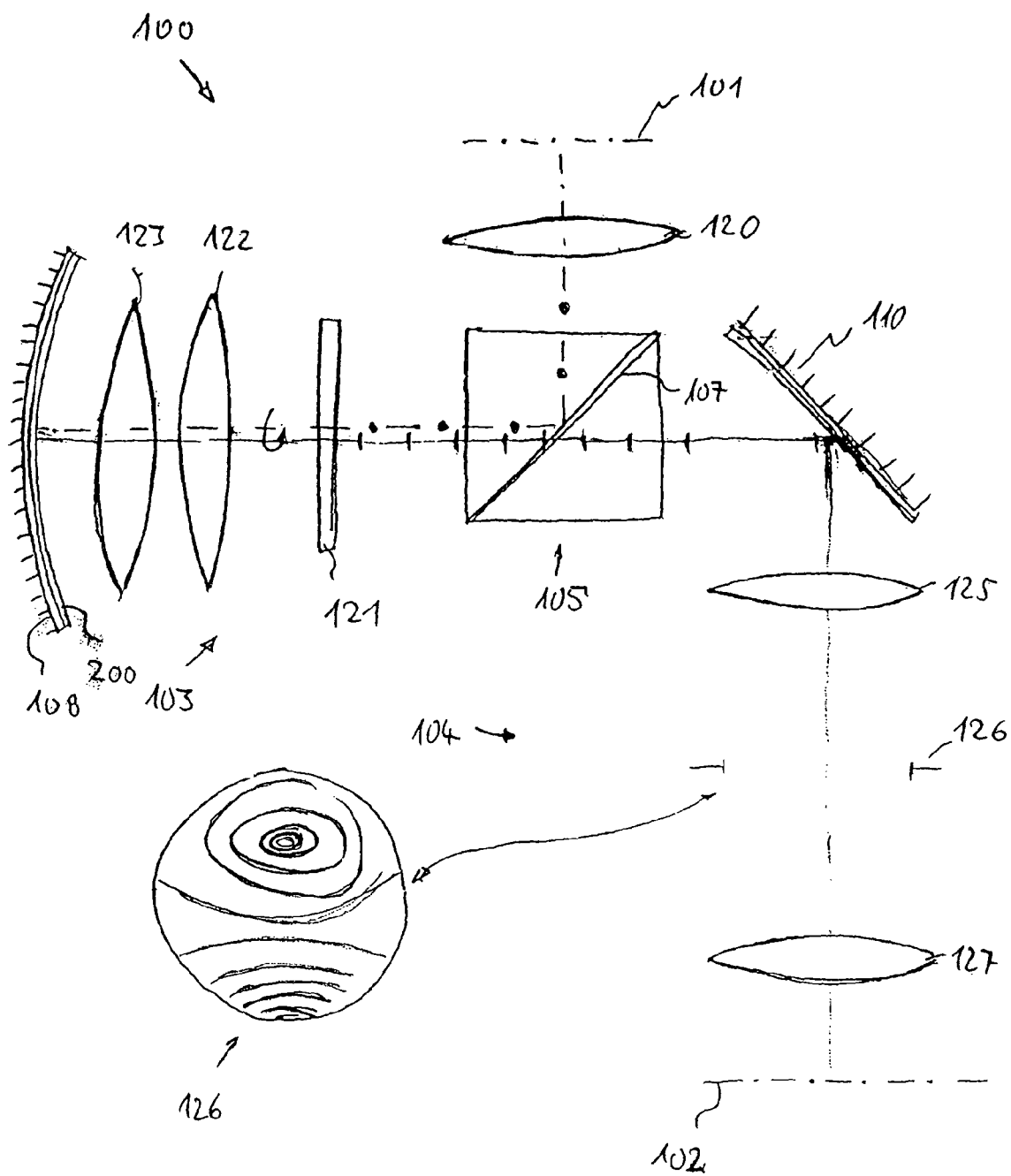
FIG. 1 is a schematic illustration of a catadioptric projection objective with a polarization beam splitter.

In order to elucidate a problem that can be solved by means of the invention, FIG. 1 schematically shows the construction of a catadioptric projection objective 100 with a polarization beam splitter. It serves for imaging a pattern of a reticle or the like arranged in its object plane 101 into its image plane 102 on a reduced scale, for example with the ratio 4:1, with exactly one real intermediate image (not shown) being generated. The projection objective, which is designed for an operating wavelength of $\lambda=157$ nm, has, between the object plane and the image plane, a first, catadioptric objective part 103 and behind that a second, purely dioptric objective part 104. The catadioptric objective part comprises a physical beam splitter 105 with a planar polarization beam splitter surface 107 oriented obliquely with respect to the optical axis, and also a mirror group with an imaging concave mirror 108. The objective part 104, which has a demagnifying effect, has a planar deflection mirror 110 inclined with respect to the optical axis, which deflection mirror makes it possible, in conjunction with the reflection at the beam splitter surface 107, to orient the mask arranged in the object plane parallel to a light-sensitive substrate arranged in the image plane 102, for example a semiconductor wafer coated with a photoresist layer. This facilitates a scanner operation of mask and wafer. Embodiments without a deflection mirror or variants with more than one deflection mirror are also possible.

Operation with polarized ultraviolet light (linearly or circularly polarized in the respective objective regions) is characteristic of projection objectives of this type, the polarization state being adapted to the properties of the beam splitter layer 107. The polarization-selective beam splitter layer essentially transmits one polarization direction and blocks the other. In this case, the rolls of the polarization components (components of the electrical field vector perpendicular and parallel to the respective plane of incidence on an optical component) are interchanged depending on whether the beam splitter layer is used in transmission or in reflection.

The exemplary system is designed such that the light coming from an illumination system, after passing through the mask arranged in the object plane 101 and a succeeding positive lens 120 is s-polarized with regard to the beam splitter layer 107 at the latest before entering the polarization beam splitter 105. The s-polarized light is deflected by the beam splitter layer 107 in the direction of the concave mirror 108 and on the light path toward that passes through a λ/4 plate 121, which converts the linearly polarized light into circularly polarized light, which impinges on the concave mirror 108 after passing through further lenses 122, 123. The light is reflected from said concave mirror and passes as still circularly polarized light in the opposite direction through the lenses 123, 122 before it passes through the λ/4 plate 121 and is converted by the latter into linearly polarized light, which is now p-polarized with regard to the beam splitter layer 107. The p-polarized light is transmitted by the beam splitter layer 107 and impinges on the deflection mirror 110, which deflects it in the direction of the image plane 102. On the path toward that the light passes through a plurality of lenses 125, 127 between which an image-side pupil surface 126 of the projection objective is situated.

All entry surfaces and exit surfaces of the lenses and of the polarization beam splitter are covered with multilayer dielectric antireflection interference layer systems (AR layers) in order to improve the transmission of the objective. The mirror surfaces of the mirrors 108, 110 are covered with highly reflective dielectric reflection interference layer systems (HR layers).

Ideally, the polarization discrimination described is perfect and the light which impinges on the individual optical components or passes through them has the respectively ideally desired preferred direction of polarization. However, light intensities of the respectively undesirable polarization component may also occur as a result of polarization-dependent effects of the interference layer systems with a profile by way of the angles of incidence used, as a result of stress-induced and/or intrinsic birefringence of the transparent optical components and/or as a result of geometry effects. As a consequence, portions of the undesirable polarization component which have different magnitudes depending on field and direction occur, which portions can be attenuated at the beam splitter layer 107. Thus, by way of example, a p-portion of the light coming from the image plane 101 may be transmitted and/or an s-portion of the light coming from the concave mirror may be reflected. These "rejected" intensity portions are then absent in the intensity of the desirable polarization component. As a result, behind the beam splitter layer intensity differences may be observed depending on the field point and on the image coordinate in the exit pupil 126 of the system even if the illumination of the reticle in the object plane 101 was still uniform. It is expedient for the considerations to regard the desirable local intensity distribution over the pupil 126, in which the diffraction pattern of the imaged mask structure is situated, as a reference state.

The offset partial figure schematically shows a spatial intensity distribution in the exit pupil 126 of the axial point under the influence of a concrete layer design of the beam splitter layer 107. In this case, the illumination intensity is higher in the region of lines lying closer together than in the regions having a lower line density. A location-dependent darkening is thus established in the exit pupil, which may provide for undesirable variations of the critical dimensions during imaging. The problems can be reduced or avoided in accordance with the invention by impairing the effect of the reflective or reflection-reducing effect of at least one interference layer system (AR layer or HR layer) present in the projection objective at suitable locations in a targeted manner such that a partial or complete compensation of spatial intensity fluctuations of the system is achieved by means of a relatively great spatial modulation of the optical efficiency of the functional layer.

Figure 2:
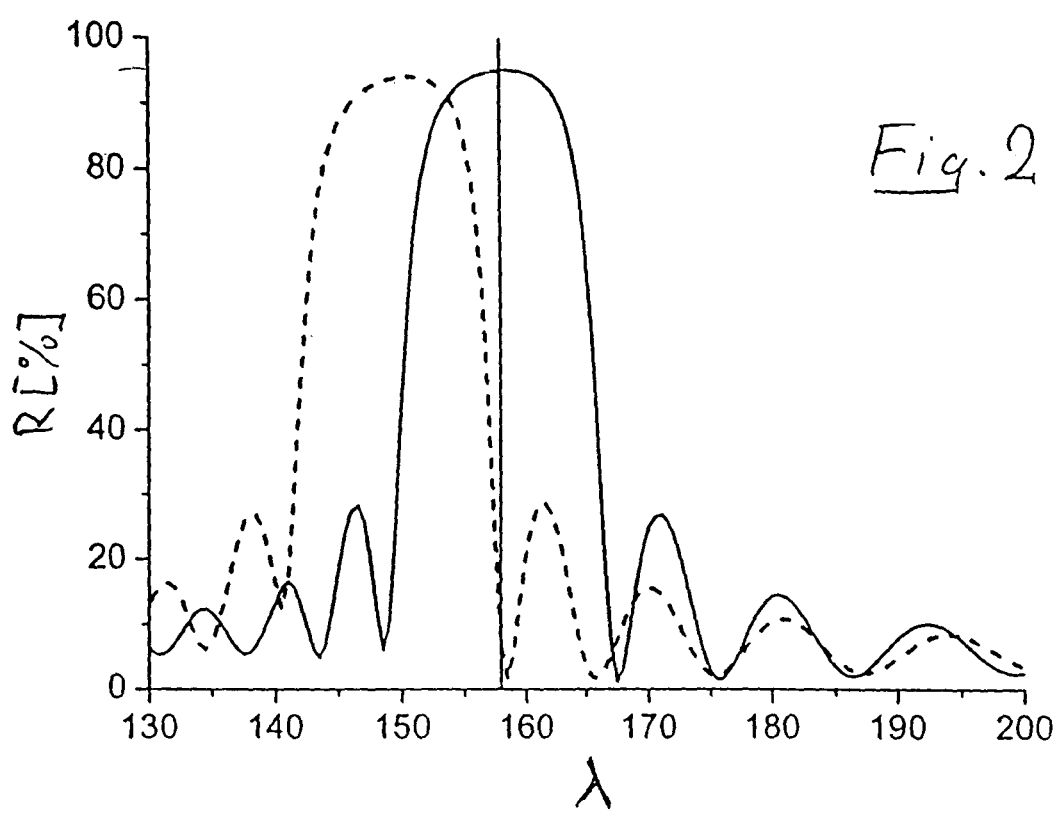
FIG. 2 is a schematic comparative diagram of the spectral profile of the reflectance of a dielectric mirror layer system with $\lambda/4$ layers, compared with a mirror layer system in which the layer thicknesses of all the individual layers have been reduced by a few percent.
Figure 3:
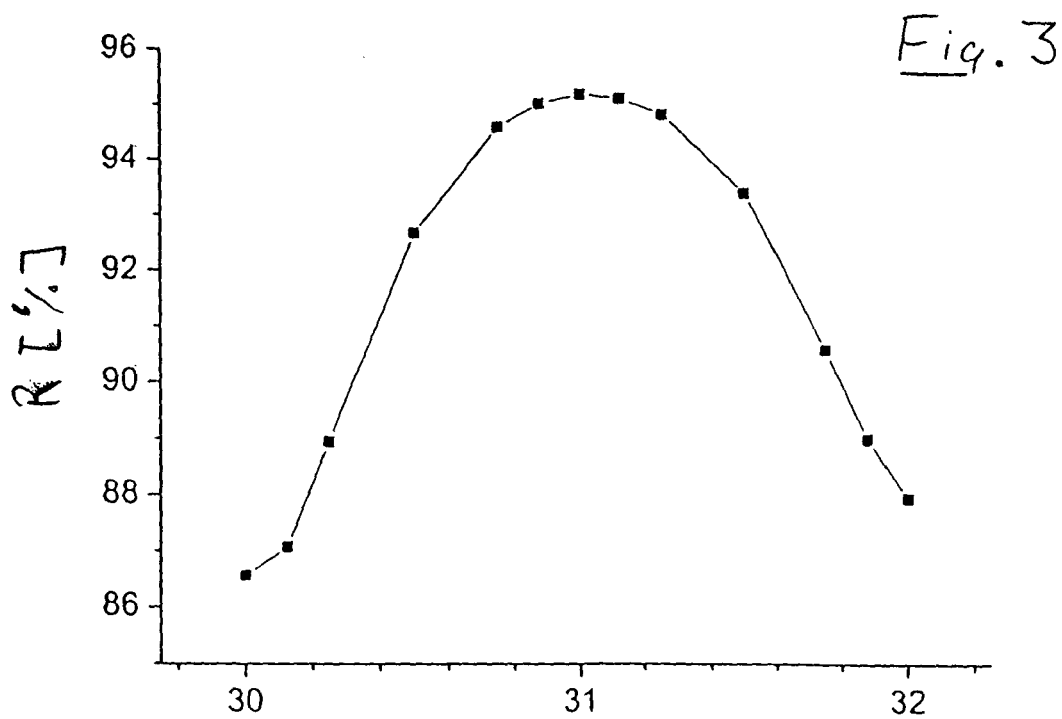
FIG. 3 is a schematic diagram showing the reflectance of a highly reflective mirror as a function of the thickness of the outermost layer.

With reference to FIGS. 2 and 3, firstly an explanation will be given of how the intensity distribution can be made more uniform through targeted, local "impairment" of the reflection effect of a mirror layer. The highly reflective multilayer interference layer system 200 fitted on the concave mirror 108 is considered by way of example for this purpose. This HR layer is particularly well suited to the desired apodization since, in the exemplary system with an intermediate image, the latter may be designed such that an optically conjugate pupil surface with respect to the exit pupil 126 is arranged in the vicinity or on the concave mirror 108. The intensity distribution of the exit pupil can thus be influenced in a targeted manner by means of spatial modulation of the reflectance of the mirror layer 200. The selection of this mirror layer for the apodization is also advantageous because only relatively small angles of incidence of the radiation occur at the concave mirror 108, which permit relatively simple layer designs with a good reflection effect.

A so-called λ/4 design may be used for said mirror layer, which design uses dielectric layers alternately having a high refractive index and a low refractive index, in which case the layer thicknesses d should satisfy the condition $n_H \cdot d_H = n_L \cdot d_L = (\lambda/4 \pm 10\%)$. In this case, the indices H, L denote the dielectric material having a high refractive index and the dielectric material having a low refractive index, n is the refractive index of the material and d is the geometrical layer thickness. λ is the operating wavelength of the system, for example 157 nm. The layer sequence for a dielectric HR layer system may begin with a layer having a high refractive index applied directly on a substrate, on which layer are then arranged N pairs comprising a layer having a low refractive index and a layer having a high refractive index (notation: $S|H|(LH)^N$). The maximum reflectance that can be achieved usually rises with the number N of layer pairs.

Examples of layer materials that are taken into consideration are lanthanum fluoride ($LaF_3$) for the layers having a high refractive index and magnesium fluoride ($MgF_2$) for the layers having a low refractive index. As an alternative, gadolinium fluoride ($GdF_3$), zirconium fluoride ($ZrF_4$), hafnium fluoride (HfF$_4$), holmium fluoride (HoF$_3$), erbium fluoride (ErF$_3$), ytterbium fluoride (YbF$_3$) or yttrium fluoride (YF$_3$) may also be appropriate as materials having a high refractive index. Alternative materials having a low refractive index are primarily chiolite, kryolite, aluminum fluoride (AlF$_3$), sodium fluoride (NaF), lithium fluoride (LiF) or barium fluoride (BaF$_2$).

It is possible to achieve the targeted impairment of the reflection efficiency at envisaged locations by reducing the layer thicknesses of all the individual layers by a few percent in a targeted manner in those regions which are intended to have a lower reflectance. For elucidation, FIG. 2 shows the spectral profile of the reflectance R of a layer stack comprising 31 λ/4 layers (solid line) and also the profile of a design in which the layer thicknesses of all the individual layers have been reduced by approximately 7% (broken line) in comparison with the nominal layer thickness λ/4. It is evident that this global layer thickness reduction leads to a "detuning" of the spectral profile to shorter wavelengths, in the example the reflection maximum (absolute value approximately 95%) shifting from the operating wavelength 157 nm to a lower wavelength of approximately 149 nm. It can be discerned that the reflectance at the operating wavelength 157 nm can accordingly theoretically be varied by means of a targeted variation of the layer thickness profile between λ/4 and λ/4·0.93 between approximately 95% (maximum value of the λ/4 design at 157 nm) and less than 10% (reflectance of the λ/4·0.93 design at 157 nm). This lower reflectance corresponds to the value of the λ/4 design at the first minimum next to the primary maximum on the side of high wavelengths. The "detuning" of the layer thicknesses thus enables a very large modulation swing in the local modulation of the reflectance.

Although it may theoretically be possible to reduce the layer thicknesses in the manner described e.g. from the center to the edge of a coated optical component by means of established diaphragm methods in coating fabrication, the manufacturing fluctuations in most standard coating methods generally have an effect such that the thickness of all the individual layers varies systematically by approximately 1%-3% from coating to coating. However, since the reflection or the reflectance falls very steeply at the edges of the primary maximum, it is necessary, when taking account of manufacturing fluctuations, to reckon with large variations in the reflectances actually obtained in the order of magnitude of between approximately 10% and approximately 30%. As a result, it becomes difficult to set the reflectance of an interference layer system over the entire usable area of the mirror, by producing a specific layer thickness profile of all the individual layers to a sufficiently precisely defined value that would permit a targeted compensation of intensity fluctuations.

In one preferred variant of the invention, a significantly lower fluctuation of local reflectances of a mirror and thus a more precise compensation of intensity fluctuations are possible. This is explained in more detail with reference to FIG. 3. The starting point is once again an HR layer system of the type S|H(LH)$^N$. The last layer in the direction of the incident light (outermost layer) is usually a layer having a high refractive index. If a layer having a low refractive index is additionally applied to said layer, this reduces the reflection effect of the layer assembly. A modulation magnitude that can typically be obtained is explained with reference to FIG. 2, which shows the reflectance of an HR layer stack comprising λ/4 layers as a function of the layer thickness of the topmost layer. The initial layer system has 31 λ/4 layers, in which case the material having a high refractive index has $n_H$=1.79 and the material having a low refractive index $n_H$=1.45. The layer adjoining the substrate has a high refractive index. The maximum reflectance of R=95.2% is achieved if the topmost layer is a λ/4 layer of the material having a high refractive index. If the thickness of the topmost H layer is progressively reduced from λ/4 to zero, the reflectance decreases continuously. This corresponds to the region between 31 and 30 layers in FIG. 2. If an additional layer made of material having a low refractive index is applied to the 31st H layer, the reflectance likewise decreases continuously until the layer thickness of the layer having a low refractive index reaches λ/4. This is illustrated in FIG. 2 in the region between 31 and 32 layers. By reducing the thickness of the topmost H layer or by additionally applying a layer made of a material having a low refractive index, it is possible to vary the reflectance between approximately 95.2% and 86.6% or 87.9% in this exemplary system. The modulation magnitude is thus restricted to approximately 10 percentage points, which simultaneously corresponds to approximately 10% of the maximum reflectance that can be achieved in absolute terms. Within this modulation magnitude, however, any arbitrary reflectance can be set with a small variation range (typically 1%-3%) without any problems even when taking account of the layer thickness fluctuations that are typical under manufacturing conditions.

Various possibilities for producing rotationally symmetrical and nonrotationally symmetrical spatial layer thickness distributions or reflectivity graduations are explained in more detail below.

Figure 4:
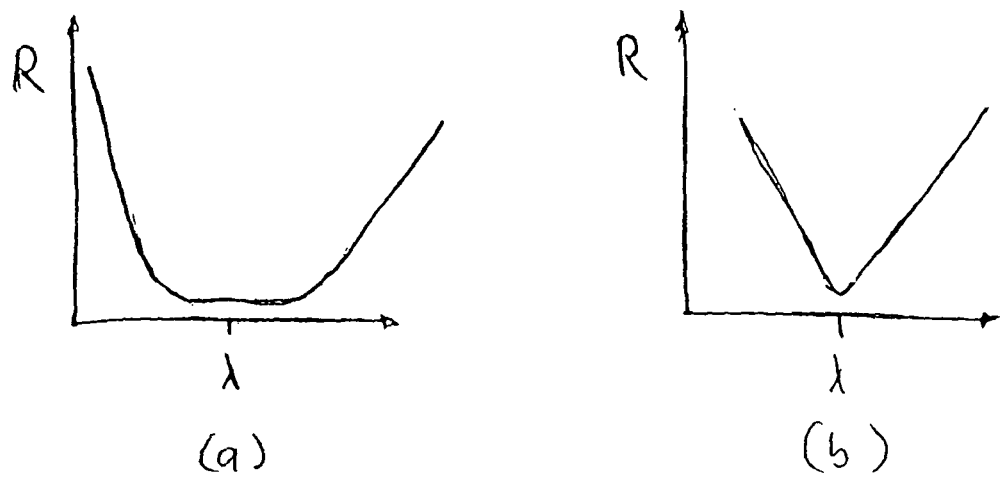
FIG. 4 shows, in a comparison, the spectral profile of the reflectance of antireflection layer systems as a function of the number of individual layers, (a) showing a wide reflection minimum in the case of an interference layer system having many individual layers and (b) showing a V-shaped, narrow reflection minimum in the case of a layer system having few individual layers.

In the case of antireflection layers (AR layers), there are various possibilities for producing a great spatial modulation of the reflectance and/or of the transmittance of the optical component with good absolute accuracy. As is known, an optimum antireflection effect of a dielectric interference layer system can only be achieved for a more or less wide layer thickness range for example by setting all the layer thicknesses to a value λ/4±10%. In this case, it must further be taken into consideration that the spectral width of a reflectivity minimum normally increases with the number of layer pairs. For elucidation, FIG. 4 schematically shows a comparison of the spectral profile of the reflectance R of an antireflection layer system with many layer pairs (FIG. 4(a)) and with few individual layers (FIG. 4(b)), in each case with a basic construction S|H(HL)$^N$. In this case, a wide reflection minimum (FIG. 4(a)) is achieved when many layer pairs made of material having a high refractive index and a low refractive index are arranged on the bottommost layer having a low refractive index (typical N>1). If, by contrast, only three layers are used (N=1), then a narrow reflection minimum results at the operating wavelength λ, the reflectance distinctly increasing more or less linearly toward larger and smaller wavelengths. Coatings having such properties are also referred to here as V-coatings (FIG. 4(b)).

Figure 5:
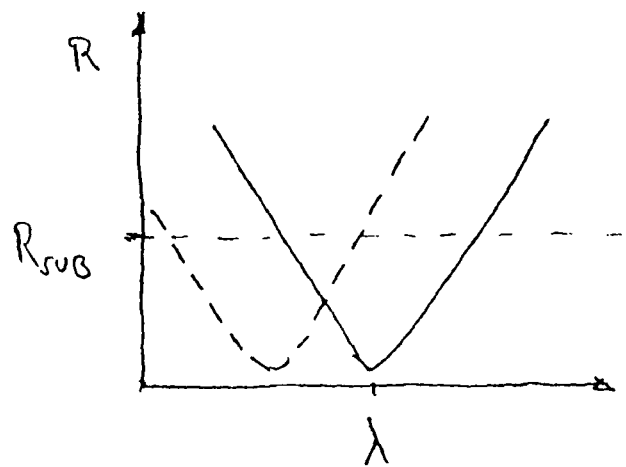
FIG. 5 shows a schematic diagram of the spectral profile of the reflectance of a V-coating comprising $\lambda/4$ individual layers (solid line) and comprising individual layers whose layer thicknesses are in each case reduced by a few percent (dashed line)
Figure 6:
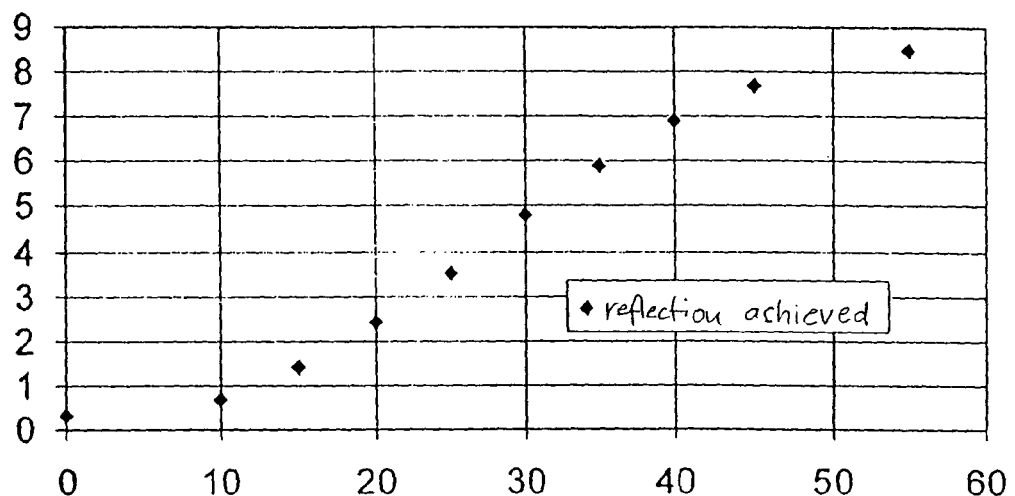
FIG. 6 shows a schematic diagram of the reflectance of an antireflection interference layer system as a function of the layer thickness change relative to a nominal layer thickness.

If all individual layers of a layer system are made significantly thicker or thinner than the nominal layer thickness, then in a V-coating the reflectance minimum shifts to shorter wavelengths, while at the operating wavelength λ the reflectance rises rapidly depending on the layer thickness detuning. FIG. 5 shows in this respect, with a solid line, the spectral profile of the reflectance in the case of a three-layer λ/4 layer system and, with a broken line, the spectral profile shifted into the short-wave in the case of a layer system with a layer thickness of all the individual layers that is approximately 30%-40% smaller. The dependence of the reflectance of an antireflection coating in the case of a change in thickness (in %) relative to the nominal optical layer thickness (e.g. λ/4) is illustrated by way of example with reference to FIG. 6. In this case, a relative change in thickness by 30% results in an increase in the residual reflectance from 0.3% to approximately 4.8%, which lies in the region of the residual reflection $R_{SUB}$ of the transparent substrate. If a diagram of the type in FIG. 6 is initially recorded for a given layer system, then it is possible to set any desired spatial modulation of the residual reflection by local variation of the layer thicknesses of the individual layers of a V-coating in the context of the maximum achievable variation of the residual reflectance (modulation magnitude approximately 8%). This involves setting the detuning of the antireflection layer through layer thickness alteration in each case only in the regions in which a comparatively high intensity occurs in the installation state of the optical component considered, so that the intensity distribution can be made more uniform after passage through the optical component.

As an alternative to the illustrated change in thickness of all the layers, it is also possible, in the case of antireflection interference layer systems, to achieve the desired profile of the residual reflectance with great modulation by means of a suitable setting of the layer thickness of only an individual layer, for example the outermost layer.

Figure 7:
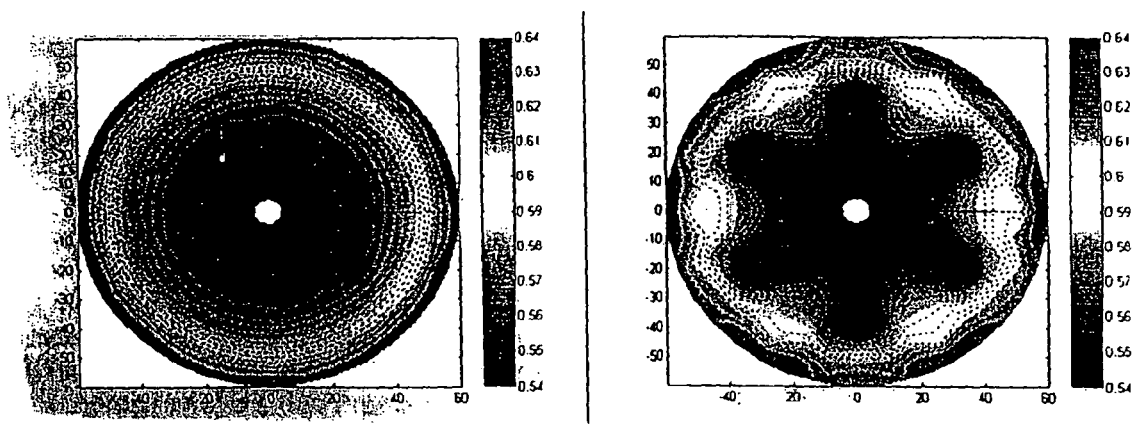
FIG. 7 schematically shows different local layer thickness distributions of interference layer systems on a lens or on a mirror.

Two possible layer thickness distributions on a lens or a mirror are illustrated by way of example with reference to FIG. 7, the relative layer thicknesses being represented by brightness values. FIG. 7(*a*) illustrates a rotationally symmetrical layer thickness distribution in which the layer thickness increases continuously from the center to the edge of the circular area. FIG. 7(*b*) shows a layer thickness distribution with 6-fold rotational symmetry in which the layer thickness is smaller in the central, star-shaped region appearing dark than in the surrounding brighter regions.

One possibility for producing the layer thickness distributions shown or other spatial layer thickness distributions which lead to corresponding spatial distributions of the transmittance or reflectance consists in the case of a given layer system with uniform layer thicknesses, for example in each case with λ/4 layers, in locally removing the outer layer by ion irradiation in such a way that the layer thickness of the outer layer varies greatly. As a result, it is possible to produce variations of the reflectance with a great modulation magnitude for example on a mirror layer whilst utilizing the effect described in connection with FIG. 3.

In the case of antireflection layers, there is the possibility of achieving the increase in reflection (or reduction of transmission) by changing the thickness of all the layers (cf. FIGS. 5 and 6) or by changing the thickness only of selected layers, in particular only of the outermost layer (cf. FIG. 3 and associated description). Changing all the thicknesses can be achieved for example by using a correspondingly calculated diaphragm arrangement in the coating of a lens, which diaphragm arrangement reduces the applied layer thicknesses approximately uniformly. If only one layer thickness is to be changed, then this can be achieved by firstly coating one or more individual layers without diaphragms or with a set of first diaphragms corresponding to a specific layer thickness and layer thickness distribution, and then using a different set of diaphragms before the production of the last layer in order to achieve a targeted spatial variation of the layer thickness.

Figure 8:
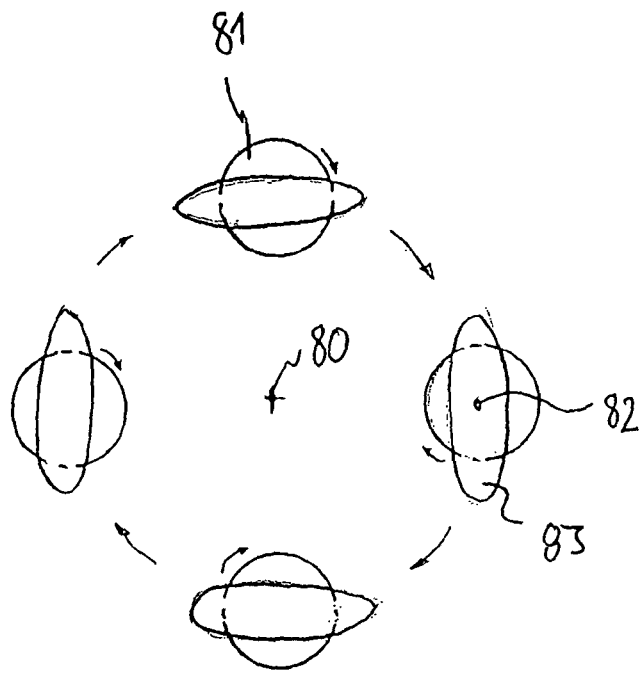
FIG. 8 schematically shows a diaphragm method for producing a rotationally symmetrical layer thickness distribution with a layer thickness that increases continuously from the center to the edge of a component.
Figure 8:
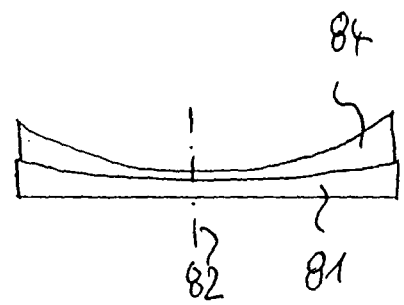
Figure 9:
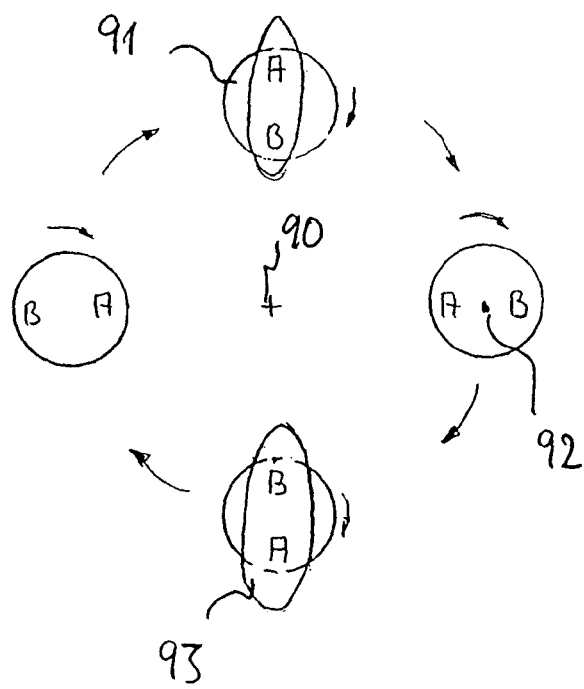
FIG. 9 schematically shows a diaphragm method for producing an optical component with an interference layer system whose layer thickness changes continuously in the transverse direction with respect to the optical axis.
Figure 9:
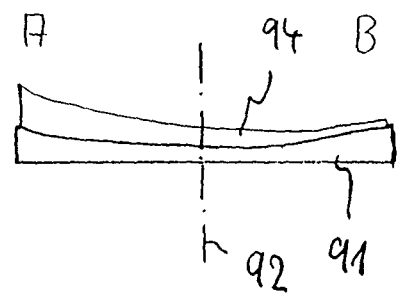

Two possibilities for achieving certain layer thickness profiles in a targeted manner with the aid of a coating apparatus with a planetary system are described by way of example with reference to FIGS. 8 and 9. The planetary system has a principal carrier (planetary carrier) (not shown), which can be rotated about a principal rotation axis 80, 90. In the case of the example, four substrate carriers (planets) are arranged at the periphery of the planetary carrier, and in each case carry a substrate to be coated in the form of a lens 81 and 91, respectively. The substrate carriers can be rotated about respective substrate carrier axes running parallel to the principal rotation axis, so that the substrates perform a global rotation about the principal rotation axis and an inherent rotation about their substrate carrier axes 82, 92 upon rotation of the principal planetary carrier and the planets. The planets are arranged above an evaporator source (not shown) and the substrates are fixed to the undersides of the planets, so that the side to be coated faces the material source. A small number of diaphragms 83, 93 stationary beneath the planets are fitted between the material source and the planets and, during the movement of the planets, at times shade the material stream coming from the evaporation material, the diaphragm form in conjunction with the revolution time of the planets determining the respective shading time, which in turn determines the deposited layer thickness.

In the embodiment in accordance with FIG. 8, the diaphragms 83 are in each case shaped ovally and arranged in centered fashion essentially about the connecting line between the material source and the point where the axis of rotation of the planets penetrates the coating surface, so that principally the center region of the substrate to be coated is shaded over longer periods of time. In the example, the diaphragm form ensures that a layer thickness profile that is rotationally symmetrical with respect to the substrate axis 82 is produced, in the case of which the layer thickness of the coating 84 increases continuously, for example approximately parabolically, from the center to the edge of the substrate. If, first of all, during the production of a reflection coating, a plurality of layers are applied so as to produce essentially a uniform layer thickness, and if then the outermost layer is subsequently applied in the manner described, a mirror can be produced given a suitable choice of the layer thickness in the center and at the edge of the substrate, the reflectance of which mirror is significantly smaller or larger at the edge than in the region of its optical axis (cf. FIG. 3).

In the embodiment according to FIG. 9, diaphragms 93 are used which extend essentially radially with respect to the principal rotation axis 90. In this case, the rotations of the planetary carrier and of the planets or the substrates are coordinated with the position of the diaphragms such that, in the case of the substrates to be coated, whenever they are partly covered by a diaphragm 93, a specific region (region B) faces the principal rotation axis and the opposite part (A) lies on the outer side. By contrast, if the substrates are situated between the diaphragms in the full material stream, then the surface region B in each case lies radially on the outside, while the surface region A lies closer to the principal rotation axis and is thus coated with a greater vapor deposition rate on average. With this configuration, during the coating process substantially more coating material is deposited on the lens regions A than on the opposite lens regions B since the regions B are shaded whenever they could be coated with greater deposition rates, while in the phases between the shading diaphragms, on account of their greater distance from the material source, they are coated with less vapor deposition material than the opposite regions A. In this way, it is possible to produce a coating 94 having, over the cross section of the substrate 91, a continuous profile of the layer thickness from high layer thicknesses in the region A to lower layer thicknesses in the region B. This technique can be used e.g. only when producing the outer layer of a λ/4 stack.

Using this basic principle, it is possible, through suitable adaptation of the transmission ratios of the gear mechanism located between principal rotary carrier and planets, also to set other symmetries of the coatings, for example 3-fold, 4-fold or 6-fold radial symmetries (cf. FIG. 7(*b*)).

On the basis of these few examples it is possible for the person skilled in the art to modify known apodization techniques in a suitable manner in order to produce reflection coatings or antireflection coatings with virtually arbitrary rotationally symmetrical or nonrotationally symmetrical layer thickness distributions.

In the following further embodiments are shown in connection with the improvement of contrast, particularly in immersion systems. A compensation of field- and pupil-dependent transmission distribution with use of absorbent optically effective elements in particular in the case of immersion media, in particular in the case of solid (SIL) or liquid immersion media is presented exemplarily.

Figure 10:
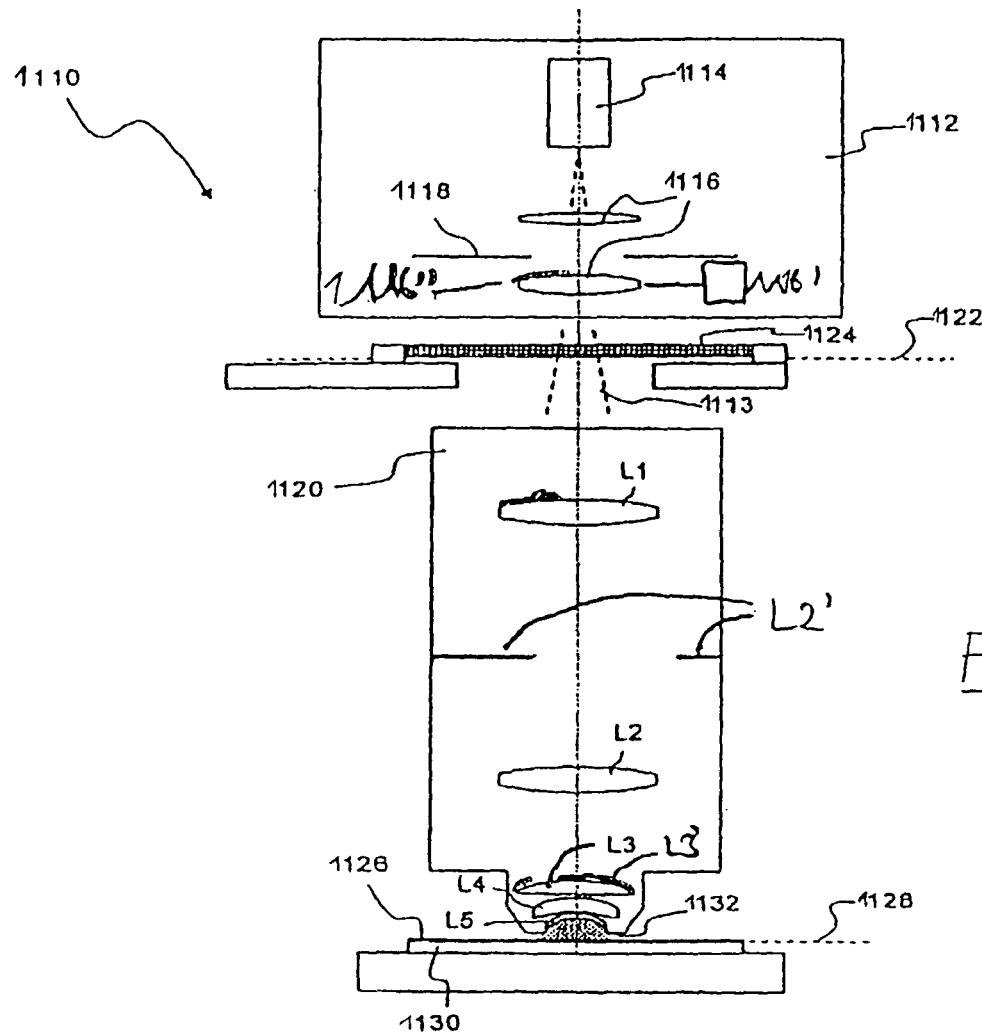
FIG. 10 shows an embodiment of a projection exposure apparatus according to the invention.

In a preferred field of application this aspect of the invention is implemented in a projection exposure apparatus for immersion lithography. FIG. 10 shows schematically a projection exposure apparatus (1110) with an illumination system (1112), an object plane (1122), a projection objective (1120), an image plane (1128), a correction element (L1) and a scattered light diaphragm (L2') for screening out extraneous light. The illumination system (1112) contains a second projection objective (1116) with a correction element (1116'', L1) and a dissipation device for heat (1116').

The above mentioned net intensity contrast and its pupil and field effect are determined by twice calculating the pupil and field profiles in the image field of the projection objective associated with the projection exposure apparatus: in the first calculation, the immersion medium is left unchanged; in the second calculation, the immersion medium is replaced by a fictitious medium which, apart from the transmission behavior, has the same optical properties as the immersion medium, but an absorption index $\alpha=0$. This results in a dependence of the pupil and field effect which follows from the geometry of the projection objective, the field size of the object field, the image-side aperture and the absorption index $\alpha$ of the immersion medium.

At DUV and VUV wavelengths $\lambda$ as are used in particular in lithography, in particular at $\lambda=248$, 193 or 157 nanometers, a number of transparent immersion media have an absorption index $\alpha$ not equal to zero, in particular the case $\alpha>0.03$ cm$^{-1}$ occurring.

In near field lithography, solids are used as immersion media which have a high refractive index n, in particular a refractive index n>1.6, or n>1.8 or even n>1.9. They are equally provided as lenses or terminating plates made e.g. of spinell, sapphire, etc.

The absorption index intrinsic to these materials is likewise higher than in customary materials such as quartz glass or $CaF_2$.

In this case, the near field is understood to mean a working distance that is less than four times the wavelength $\lambda$ or even less than the wavelength $\lambda$. In this case, the working distance is the distance from the image plane of the projection objective to the last optical element before the image plane of the projection objective.

In accordance with the absorption law $$T(L)=e^{-\alpha L}$$

the transmitted intensity decreases exponentially with the absorption index $\alpha$ and the distance L traversed. This results in a nonuniform transmission over the pupil depending on the field position.

Figures 10A, 10B:
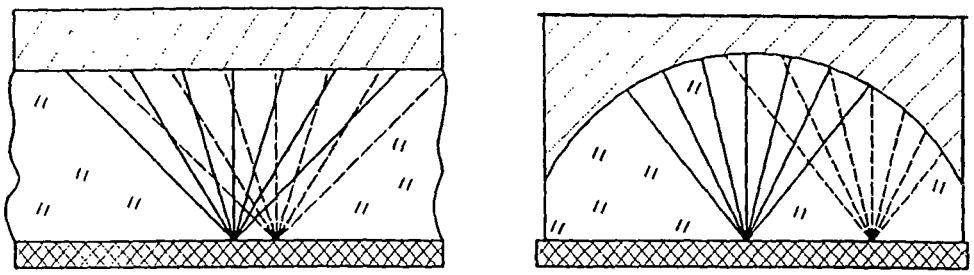
FIG. 10a shows the path length of individual rays of the illumination light beam belonging to a field point of the image field in an immersion medium bounded by two plane surfaces.
FIG. 10b shows the path length of individual rays of the illumination light in the case of such a medium which is bounded by a lower plane surface and an upper spherical and convex surface.

Between planar interfaces, the optical path increases cosinusoidally with the propagation angle in the material, no field variation being produced in the case of telecentric imaging. These facts can be inferred from FIG. 10a).

If the underside of the optical element which is situated above the immersion medium is curved, then what is involved is an immersion lens, in particular a liquid lens, which has refractive power, in particular positive refractive power. A field dependence is then directly evident FIG. 10b).

A further possibility for describing this problem area is set forth as follows:

In high-aperture systems with large field magnitudes, as in lithography objectives, large path length differences occur in optically effective lenses made of solid materials or made of fluids, particularly liquids. For instance, such an optical element may have path lengths of the upper and lower aperture rays emerging from a point associated with an object plane of the element which differ by more than 15% in the region of the optical element.

Figure 16:
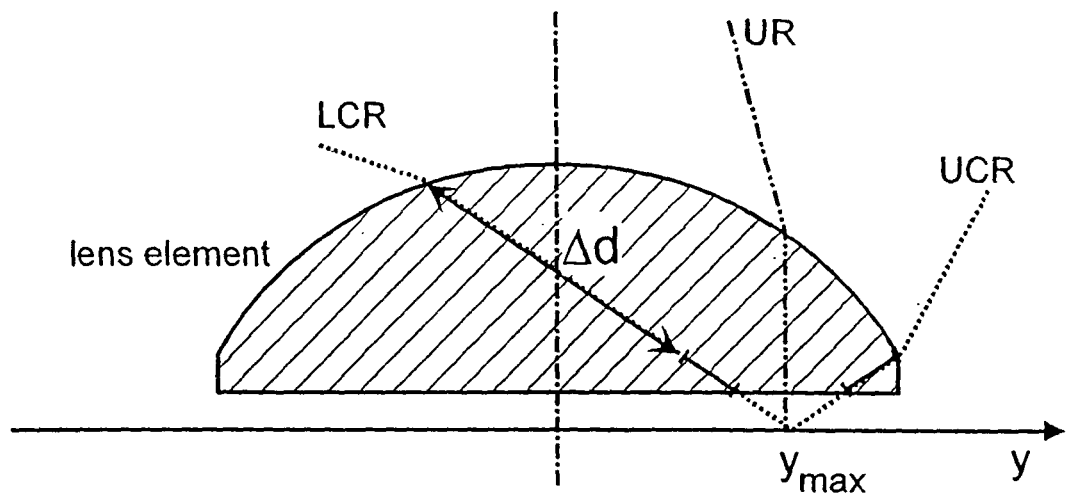
FIG. 16 illustrates the path length difference $\Delta d$ in the optical element, in particular in the immersion medium, between upper and lower aperture ray.

The example from FIG. 16 shows the maximum path length difference between upper aperture ray (UCR—upper coma ray=upper aperture ray) and lower aperture ray (LCR—lower coma ray=lower aperture ray); both aperture rays assume the angle given by arcsin(NA/n (immersion)) at the maximum field point $y_{max}$ with respect to the principal ray (UR—unit ray).

Due to the dictates of geometry, a considerable path length difference of $\Delta d$ occurs in particular in the last lens element. This path length difference leads to the maximum normalized intensity difference in the pupil:

$$\Delta I=(1-10^{-K\cdot\Delta d})[\%]$$

Examples of materials of which the optical element may be composed and their absorption constants are:
$CaF_2$: K<0.0005/cm
$SiO_2$: K=0.0015/cm
$H_2O$: K=0.038/cm
$BaF_2$: K~0.03/cm Water $H_2O$, in particular, has a 20-fold higher absorption than $CaF_2$.

A path length difference between two rays thus gives rise to an intensity difference in the exit pupil. This leads to a telecentric error, to ellipticity errors and thus to a field-dependent distortion, structure width variations and loss of contrast during imaging. Particularly during the imaging of fine structures with so-called dipole settings, the attenuation of one order of diffraction relative to the opposite order of diffraction in the pupil is manifested in these image errors. In this case, in particular, the intensity difference has a maximum effect on the loss of contrast during imaging with $\Delta V=0.5\cdot\Delta I$.

Given a path length difference of 30 mm, an intensity difference of 1% occurs in quartz. From approximately $\Delta d>60$ mm, the intensity difference becomes greater than 2% and the loss of contrast in imaging thus becomes greater than 1%. However, this undesired loss of contrast may occur in high-aperture systems due to the path length differences that occur there.

In the case of water and various other materials appropriate for optical elements with refractive power, the absorption is much greater, as specified above. In the case of a water lens, for example, the path length difference should be no more than 3.5 mm to obtain an intensity difference of $\Delta I<2\%$.

Figure 17:
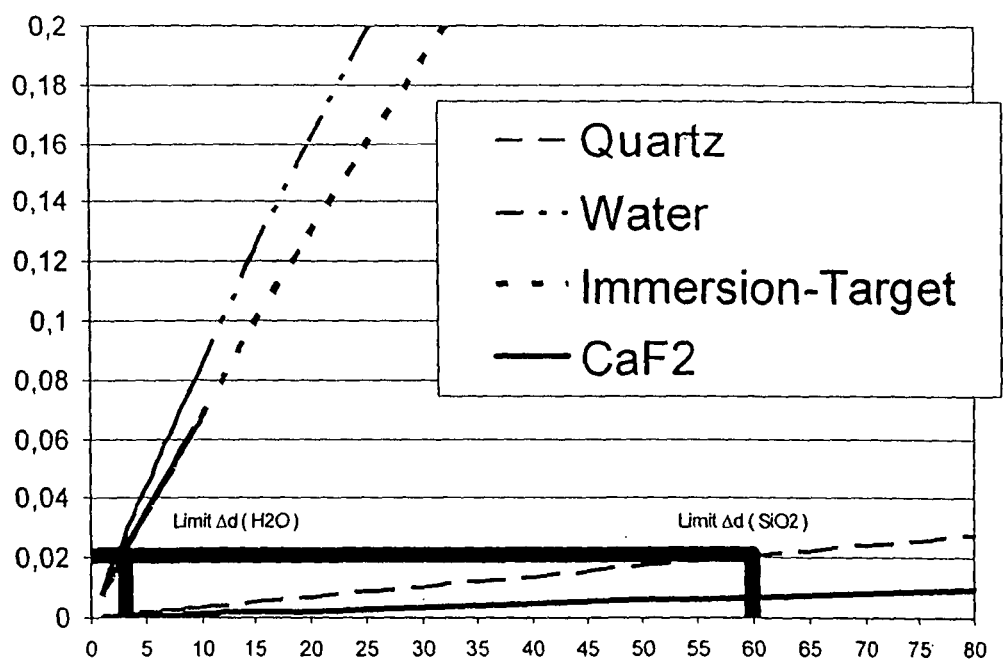
FIG. 17 plots the normalized intensity difference $\Delta I$ in % against the path length difference $\Delta d$ in the optical element, especially an immersion medium, for different materials of which the optical element may be composed.

The example from FIG. 17 is given for the last optically effective element before the image plane since the largest numerical apertures NA in the overall system occur there. Of course, similar effects may also occur in proximity to intermediate images, where the numerical aperture NA and thus the angles of the upper and lower coma rays with respect to an axially remote field point are given by the numerical aperture at the intermediate images and are generally smaller however.

Since the nonuniform pupil transmission leads to lithographic imaging errors, it is necessary to compensate for them by means of a correction element, preferably a series of filters in the projection objective and/or in the illumination system.

It is advantageous to know the pupil and field profile of the transmission precisely. By way of example, it is specified analytically for the case of a spherically and convexly curved top side of the immersion medium as outlined in FIG. 10b, the analytical calculation preferably involving approximation by means of polynomials.

Figure 11A:
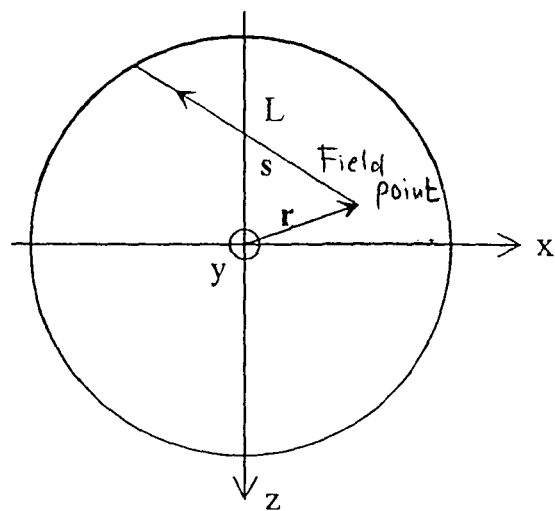
FIG. 11a,b show the system of coordinates used in a sub-pupil.

The underlying geometry is outlined in FIG. 11a: what is sought is the optical path length from an arbitrary field point r below the spherical interface with radius R up to the spherical interface as a function of the pupil coordinate (p, q)=(cos φ sin θ sin φ sin θ) and the field point coordinate r.

The straight line from the field point r up to a point R on the spherical interface is characterized by the direction vector s $$\vec{s} = \begin{pmatrix} p \\ q \\ \sqrt{1-p^2-q^2} \end{pmatrix} = \begin{pmatrix} \cos\varphi \sin\vartheta \\ \sin\varphi \sin\vartheta \\ \cos\vartheta \end{pmatrix}$$

and the length L and satisfies the equation i.e.

$$\vec{r} + \vec{s}L = \vec{R}$$

i.e.

$$|\vec{r} + \vec{s}L|^2 = R^2$$

For L this results in the quadratic equation ($r=|\vec{r}|$, $R=|\vec{R}|$)

$$L^2 + 2\vec{r}\cdot\vec{s}L + r^2 - R^2 = 0$$

with the solution $$L = \pm\sqrt{|\vec{r}\cdot\vec{s}|^2 - r^2 + R^2} - \vec{r}\cdot\vec{s}$$

The positive sign is to be chosen before the root since L must be positive and R>>sr.

Figure 12:
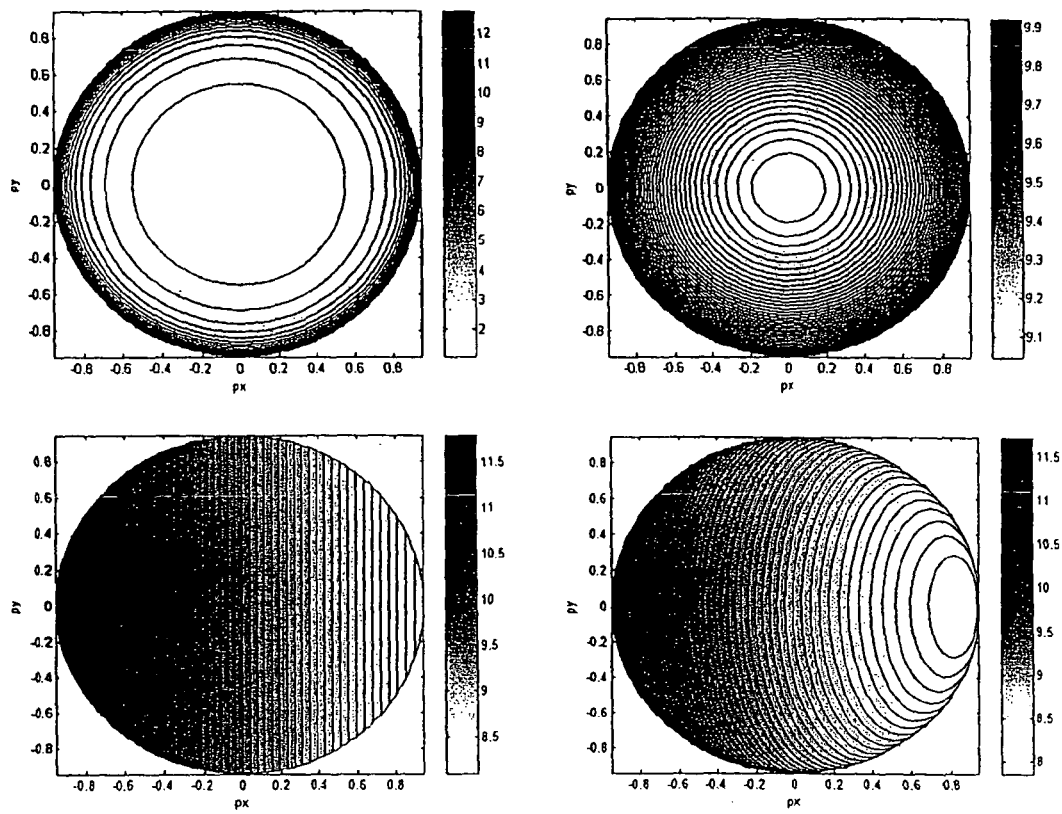
FIG. 12 shows pupil profiles of the path lengths L for a few field points given a constant radius R.

In FIG. 12, L is outlined for a few field points given a constant radius R.

The overall transmission thus reads analytically $$T = e^{-\alpha\left(\sqrt{|\vec{r}\cdot\vec{s}|^2 - r^2 + R^2} - \vec{r}\cdot\vec{s}\right)}$$

In order to compensate for the absorption corresponding to this transmission T, it is necessary to use an optically effective element whose transmission over field and pupil runs inversely with respect to the transmission distribution of the highly absorbent optically effective element, in particular the immersion liquid or the solid immersion lens (SIL).

In particular, a sequence of filters is sought which compensates for a given apodization profile in field and pupil. In principle, two types and corresponding hybrid forms may be used for this purpose:

Space-Variant Filters

These filters have a location-dependent effect which, at least to a good approximation, is independent of the angle of incidence. They thus act on the pupil in the pupil and on the field in the field. In an intermediate region, they act on the subpupil of the given plane.

Figure 11B:
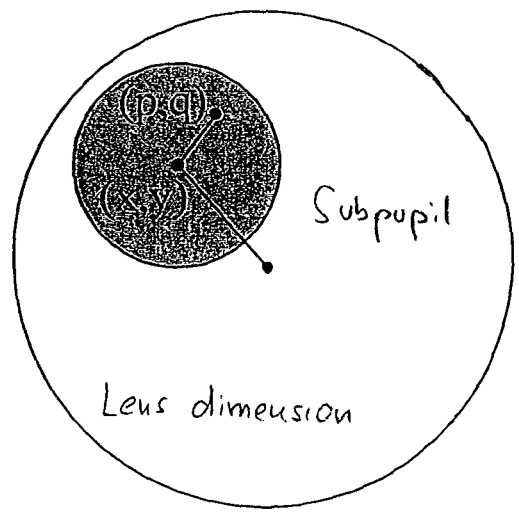

In this case, the subpupil of a field point on a plane is that region in the plane which is illuminated by the light cone emerging from this field point with the object-side geometrical aperture $A_o$. Diameter and form of the subpupil are approximately independent of the position of the field point and thus depend only on the object-side geometrical aperture $A_o$ and the plane considered, cf. FIG. 11b. The object-side geometrical aperture $A_o$ is connected with the image-side geometrical aperture A by means of the imaging scale b intrinsic to the projection objective. In general, $A_o = A*b$ holds true, preferably where b=0.25.

The various locations at which pupils and fields of a projection objective are situated can in reality only be determined approximately. Reference is therefore made to pupil-near and field-near regions.

If a region of a projection objective is neither field-near nor pupil-near, then it is referred to as an intermediate region.

More precisely, the following system of designation shall be defined:

u shall be an outermost field point of the object plane, preferably with a field height of more than 6 mm. O shall designate the point of intersection between the optical axis of the projection objective and the object plane. $h_h$ shall be the height of the principal ray from u and $h_a$ shall be the maximum height of an aperture ray proceeding from O, both measured in a plane Φ perpendicular to the optical axis of the projection objective. An optical element associated with the projection objective shall be called field-near (synonymously in proximity to a field plane) if, measured in its principal plane Φ, $h_a/h_h < \tau$ holds true, and pupil-near (synonymously in proximity to a pupil plane) if $h_a/h_h > 1/\tau$ holds true. In this case, τ is a parameter to be chosen where 0<τ<1, preferably τ=0.1 or τ=0.2 or τ=0.4. An optical element which is neither field-near nor pupil-near shall be referred to as associated with the intermediate region.

Angle-Variant Filters

These filters have an angle-dependent effect which, to a good approximation, is independent of location. They thus act on the field in the pupil and on the pupil in the field.

Combined Filters

These filters have an effect that results from the superposition of a space-variant with an angle-variant filter.

Figure 13A:
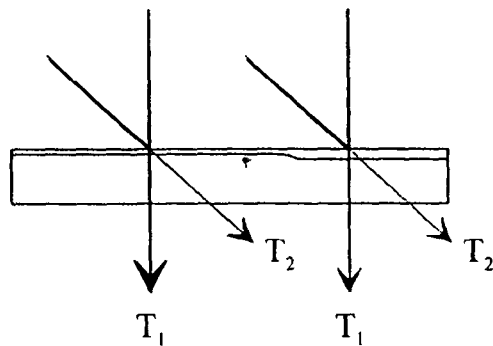
FIG. 13a shows a filter which acts by means of varying layer thicknesses.
Figure 13B:
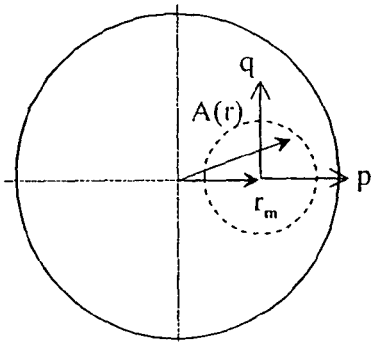
FIG. 13b shows a parameterization of field and pupil.

The above filters are realized by location-dependent layer thicknesses, cf. FIG. 13, with space- and/or angle-dependent transmission, by neutral filters, or by a combination of location-dependent layer thicknesses and neutral filters.

In this case, the neutral filters may in particular be realized in turn by chromium layers having a different layer thickness, which leads to an absorption of the light used. This absorbed light leads to heat, which may lead to aberrations within the projection exposure apparatus, in particular the projection objective.

An analogous problem occurs when using layers which are at least partially reflective. The reflected light, called extraneous light or synonymously scattered light, may have to be able to absorbed.

Devices which perform this compensation are necessary for this in such cases. These devices preferably dissipate the resistive heat or preferably mask out the extraneous light by means of additional diaphragms.

Implementation in Quadratic Approximation

The analytical calculation is implemented here by way of example for a rotationally symmetrical immersion medium. Since the field dependence of the absorption is then itself rotationally symmetrical, it is also the case that only rotationally symmetrical filter elements are required. The field point variation therefore takes place only in the x direction, cf. FIG. 13b).

The absorption of the correction element can be written up to quadratic terms as follows.

$$A(r) = a_0 + a_1 r^2$$
$$= a_0 + a_1((vp + (1-v)r_m)^2 + v^2 q^2)$$
$$= a_0 + a_1 v^2 (p^2 + q^2) + a_1 (1-v)^2 r_m^2 + 2v(1-v) a_1 p r_m$$

The effect thus consists in a pure field effect, a pure pupil effect and a mixed term. The ratio is regulated by the value of v. A pure field effect is present for v=0 and a pure pupil effect is present for v=1.

If the radius R is large in relation to the field point position, the path length L can likewise be developed up to the quadratic order. If the field valuation is additionally restricted to the x direction (without restricting generality) and the following results:

$$L \approx R \left[ 1 + \frac{|\vec{r} \cdot \vec{s}|^2 - r^2}{2R^2} \right] - \vec{r} \cdot \vec{s}$$
$$\approx R + \frac{1}{2R}(2xpzm + z^2 m^2 - x^2 - z^2) - xp - zm$$

with
$$z^2 m^2 = z^2 (1 - p^2 - q^2)$$
$$zm \approx z\left(1 - \frac{p^2}{2} - \frac{q^2}{2}\right)$$

this means that $$L \approx R + \frac{1}{2R}(2xpz + z^2 - z^2 p^2 - z^2 q^2 - x^2 - z^2) - xp - z + \frac{zp^2}{2} + \frac{zq^2}{2}$$

$$L \approx \underbrace{R - z}_{\text{constant}} \underbrace{-\frac{x^2}{2R}}_{\text{field pure}} + \underbrace{\left(\frac{z}{R} - 1\right)xp}_{\text{intermediate region}} + \underbrace{\frac{z}{2}\left(1 - \frac{z}{R}\right)(p^2 + q^2)}_{\text{pupil pure}}$$

Since the path length is decomposed into a sequence of summands, the absorption can be represented by the product of the associated transmissions:

$$L \approx \sum_j L_j \Rightarrow T \approx \prod_j e^{\alpha L_j}$$

The absorption profile can be compensated for in quadratic approximation by three filters with a quadratic profile in 1) intermediate region, 2) field, 3) pupil, as is shown below.

In the intermediate region:

$$A_1(r) = a_1 \hat{r}^2$$

With the normalized radius $\hat{r}$. Given a subpupil radius of v, this means that $$a_1 = \frac{1}{2v(1-v)}\left(1 - \frac{z}{R}\right)$$

For v≠0 and v≠1, this filter compensates for the profile $$\left(\frac{z}{R} - 1\right)xp,$$

that introduces a field profile of $a_1(1-v)^2 \hat{r}^2$ and a pupil profile of $a_1 v^2(p^2+q^2)$. These have to be compensated for by field and pupil filters. It is advantageous if they are used to compensate for field and pupil profiles present.

In the field region, it is then the case that $$A_2(r) = a_2 \hat{r}^2$$

where $$a_2 = \frac{1}{2R} - a_1(1-v)^2$$

And finally in the pupil region $$A_3(r) = a_3 \hat{r}^2$$

where $$a_3 = -\frac{z}{2}\left(1 - \frac{z}{R}\right) - a_1 v^2$$

it is the case that $$a_3 = -\frac{z}{2}\left(1 - \frac{z}{R}\right) - \frac{v}{2}\left(1 - \frac{z}{R}\right) = -\frac{1}{2}(z+v)\left(1 - \frac{z}{R}\right)$$

Negative absorptions must be converted into purely positive and thus physically possible absorptions by means of constant components.

Maintenance of the Projection Exposure Apparatus

The transmission behavior even of absorbent substances and optical elements formed therefrom varies as the projection exposure apparatus is used. This alteration can be described by simulation or by measurement, preferably by a parameter β; in particular, β=α or β=K may hold true. The parameter β is thus the newly simulated or measured transmission index of the immersion medium the newly measured absorption constant K of the immersion medium.

The correction element then has to be adapted; preferably, the filters defining it are altered in terms of their position or embodiment; in particular, the filter elements are exchanged.

This process enables aberrations of secondary nature to be introduced into the projection exposure apparatus, in particular into the projection objective, which then have to be at least partially corrected. This correction may be effected by manipulating the position of optical elements, by manipulating the form of optical elements, cf. U.S. Pat. No. 5,805,273 A1 or by surface processing of optical elements, cf. U.S. Pat. No. 6,268,903 B1.

CONCLUDING REMARKS

Analogous problem areas with regard to the transmission behavior arise in any projection exposure apparatus which contains an optically effective element exhibiting a transmission behavior that differs significantly from the transmission behavior of the other optically effective elements used: namely absorbs to a greater extent, specifically absorbs to a greater extent by up to one or more orders of magnitude. The traditional conceptualization of the immersion medium was used above only for the sake of better understanding. It is not intended in any way to restrict the scope of protection of the invention.

Figure 14:
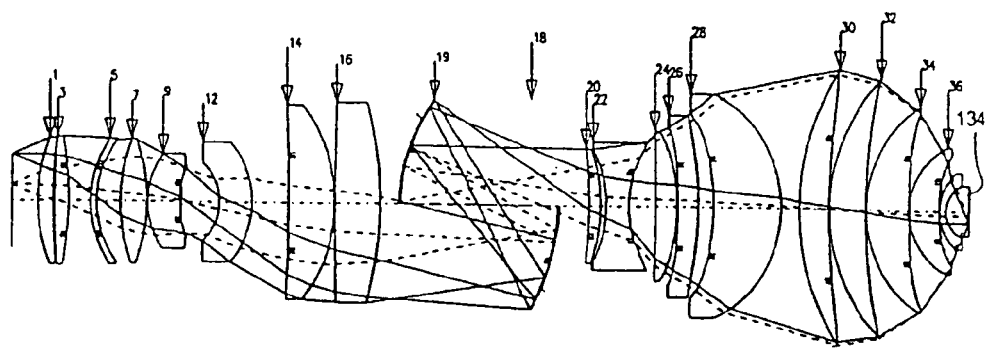
FIG. 14 shows a projection objective with an immersion medium.
Figure 15:
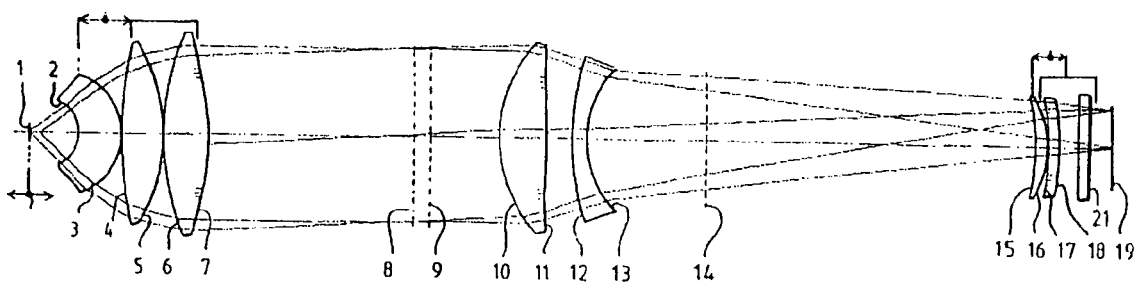
FIG. 15 shows a second projection objective associated with the illumination system.

The invention may be incorporated into a microlithographic projection objective as shown exemplarily in FIG. 14. Some basic design principles of such two-mirror in-line catadioptric projection objectives have been disclosed e.g. in U.S. provisional application 60/536,278 filed by the applicant on Jan. 14, 2004. The invention can also be implemented into imaging optical systems designed to image an intermediate image plane into a final image plane of an illumination system, such as shown exemplarily in FIG. 15. The numbers in the figures designate selected optical surfaces.

The invention claimed is:

1. A projection exposure apparatus comprising an illumination system and a projection objective,
    the projection objective comprising an optically effective element which causes a net intensity contrast of greater than 3% pupil effect or field effect, which causes a transmission profile error, and
    at least one of the illumination system and the projection objective comprising a correction element for correcting the transmission profile error which is caused by the net intensity contrast,
    wherein the correction element:
        is spaced apart from the optically effective element and consists essentially of a sequence of at least three filters located in a sequence of locations, the locations comprising a field region, a pupil region and an intermediate region that is intermediate between the field region and the mil region, of at least one of the illumination system and the projection objective, and
    wherein the sequence of filters compensates for the transmission profile error.

2. The projection exposure apparatus as claimed in claim 1, wherein the projection objective has an image-side geometrical aperture A of more than 0.6.

3. The projection exposure apparatus as claimed in claim 1, wherein the projection objective has an image-side numerical aperture NA of more than 0.9.

4. The projection exposure apparatus as claimed in claim 1, wherein the optically effective element is a liquid or a solid.

5. The projection exposure apparatus as claimed in claim 1, wherein the projection objective has an image plane and wherein the optically effective element is a last element before the image plane that is optically effective.

6. The projection exposure apparatus as claimed in claim 1, wherein the optically effective element is a liquid lens of an immersion objective.

7. The projection exposure apparatus as claimed in claim 6, wherein the liquid is water.

8. The projection exposure apparatus as claimed in claim 6, wherein a side of the liquid lens that faces the object plane is plane.

9. The projection exposure apparatus as claimed in claim 6, wherein that side of the liquid lens which faces the object plane is convex.

10. The projection exposure apparatus as claimed in claim 1, wherein the correction element consists of space-variant, angle-variant or space- and angle-variant filter elements fitted in at least one of the illumination system and in the projection objective.

11. The projection exposure apparatus as claimed in claim 10, wherein at least one of the filter elements is situated in the illumination system, and wherein the one filter element is a space-variant filter element which is situated in proximity to a field plane of a second projection objective associated with the illumination system, or the one filter element is an angle-variant filter element which is situated in proximity to a pupil plane of the second projection objective associated with the illumination system.

12. The projection exposure apparatus as claimed in claim 10, wherein at least one of the filter elements is situated in the projection objective, and wherein the one filter element is a space-variant filter element which is situated in proximity to a field plane of the projection objective, or is an angle-variant filter element which is situated in proximity to a pupil plane of the projection objective.

13. The projection exposure apparatus as claimed in claim 10, wherein at least one of the filter elements is situated in the projection objective, and wherein the one filter element is an angle-variant filter element which is situated in proximity to a field plane of the projection objective, or is a space-variant filter element which is situated in proximity to a pupil plane of the projection objective.

14. The projection exposure apparatus as claimed in claim 10, wherein at least one of the filter elements is situated in the projection objective, and wherein the one filter element is a space- and angle-variant element which is situated in proximity to a field plane or a pupil plane of the projection objective.

15. The projection exposure apparatus as claimed in claim 10, wherein at least one of the filter elements is situated in the intermediate region of the projection objective.

16. The projection exposure apparatus as claimed in claim 10, wherein at least one of the filter elements is configured to be exchangeable within or insertable into the projection exposure apparatus.

17. The projection exposure apparatus as claimed in claim 16, further comprising a second correction element, which contributes to a second correction of image errors resulting from exchange or insertion of the one filter element.

18. The projection exposure apparatus as claimed in claim 17, wherein the second correction by the second correction element comprises an alteration in position of the second correction element or an alteration in form of the second correction element.

19. The projection exposure apparatus as claimed in claim 18, wherein the alteration in form of the second correction element comprises a removal of material at a surface of the second correction element or application of a force on or within the second correction element.

20. The projection exposure apparatus as claimed in claim 1, wherein the correction element consists essentially of a first filter in the field region of at least one of the illumination system and the projection system, a second filter in the pupil region of at least one of the illumination system and the projection system, and a third filter in the intermediate region that is in neither the field region nor the pupil region.

21. The projection exposure apparatus as claimed in claim 20, wherein the first filter, the second filter and the third filter each has a quadratic profile.

22. The projection exposure apparatus as claimed in claim 20,
    wherein the at least one of the illumination system and the projection system defines an applicable system;
    wherein the first filter located in the field region of the applicable system is positioned to satisfy a condition $h_a/h_{h} < \tau$, and
    wherein the second filter located in the pupil region of the applicable system is positioned to satisfy a condition $h_a/h_{h} > 1/\tau$, where $h_a$=the maximum height of an aperture ray proceeding from a point of intersection between the optical axis of the applicable system and the object plane of the applicable system, where $h_h$=the height of the principle ray from an outermost field point of the object plane of the applicable system, and where $\tau$=0.2.

23. The projection exposure apparatus as claimed in claim 1, wherein the at least three filters are each positioned physically and optically separate from the optically effective element.

24. A projection exposure apparatus comprising an illumination system and a projection objective,
the projection objective comprising an optically effective element with an absorption index $\alpha$>0.03 cm$^{-1}$, which causes a transmission profile error,
wherein at least one of the illumination system and the projection objective comprises a correction element for correcting the transmission profile error, and
wherein the correction element:
is spaced apart from the optically effective element and consists essentially of a sequence of at least three filters located in a sequence of locations, the locations comprising a field region, a pupil region and an intermediate region that is intermediate between the field region and the pupil region, of at least one of the illumination system and the projection objective, and
wherein the sequence of filters compensates for the transmission profile error.

25. The projection exposure apparatus as claimed in claim 24, wherein the absorption index $\alpha$ is measured.

26. The projection exposure apparatus as claimed in claim 24, wherein the projection objective has an optical axis and an object plane, wherein a point associated with the object plane is located at a distance of at least 6 mm from the optical axis, and wherein path lengths of an upper aperture ray and of a lower aperture ray emerging from the point differ by more than 15% in a region of the optically effective element.

27. The projection exposure apparatus as claimed in claim 24, wherein the correction element consists essentially of a first filter in the field region of at least one of the illumination system and the projection system, a second filter in the pupil region of at least one of the illumination system and the projection system, and a third filter in the intermediate region that is in neither the field region nor the pupil region.

28. The projection exposure apparatus as claimed in claim 27, wherein the first filter, the second filter and the third filter each has a quadratic profile.

29. The projection exposure apparatus as claimed in claim 27,
wherein the at least one of the illumination system and the projection system defines an applicable system;
wherein the first filter located in the field region of the applicable system is positioned to satisfy a condition $h_a/h_h<\tau$, and
wherein the second filter located in the pupil region of the applicable system is positioned to satisfy a condition $h_a/h_h>1/\tau$,
where $h_a$=the maximum height of an aperture ray proceeding from a point of intersection between the optical axis of the applicable system and the object plane of the applicable system,
where $h_h$=the height of the principle ray from an outermost field point of the object plane of the applicable system, and
where $\tau$=0.2.

30. The projection exposure apparatus as claimed in claim 24, wherein the at least three filters are each positioned physically and optically separate from the optically effective element.

31. A projection exposure apparatus comprising an illumination system and a projection objective,
the projection objective comprising an optically effective element with a refractive index n>1.6, which causes a transmission profile error,
wherein at least one of the illumination system and the projection objective comprises a correction element for correcting the transmission profile error, and
wherein the correction element:
is spaced apart from the optically effective element and consists essentially of a sequence of at least three filters located in a sequence of locations, the locations comprising a field region, a pupil region and an intermediate region that is intermediate between the field region and the pupil region, of at least one of the illumination system and the projection objective, and
wherein the sequence of filters compensates for the transmission profile error.

32. The projection exposure apparatus as claimed in claim 31, wherein the correction element consists essentially of a first filter in the field region of at least one of the illumination system and the projection system, a second filter in the pupil region of at least one of the illumination system and the projection system, and a third filter in the intermediate region that is in neither the field region nor the pupil region.

33. The projection exposure apparatus as claimed in claim 32, wherein the first filter, the second filter and the third filter each has a quadratic profile.

34. The projection exposure apparatus as claimed in claim 32,
wherein the at least one of the illumination system and the projection system defines an applicable system;
wherein the first filter located in the field region of the applicable system is positioned to satisfy a condition $h_a/h_h<\tau$, and
wherein the second filter located in the pupil region of the applicable system is positioned to satisfy a condition $h_a/h_h>1/\tau$,
where $h_a$=the maximum height of an aperture ray proceeding from a point of intersection between the optical axis of the applicable system and the object plane of the applicable system,
where $h_h$=the height of the principle ray from an outermost field point of the object plane of the applicable system, and
where $\tau$=0.2.

35. The projection exposure apparatus as claimed in claim 31, wherein the at least three filters are each positioned physically and optically separate from the optically effective element.

36. A projection exposure apparatus comprising an illumination system and a projection objective,
the projection objective comprising an optically effective element whose surface facing the image plane of the projection objective is plane and whose distance from the image plane is less than four times the wavelength $\lambda$ of the projection light, which causes a transmission profile error, and
wherein at least one of the illumination system and the projection objective comprises a correction element for correcting the transmission profile error, and wherein the correction element:
  is spaced apart from the optically effective element and consists essentially of a sequence of at least three filters located in a sequence of locations, the locations comprising a field region, a pupil region and an intermediate region that is intermediate between the field region and the pupil region, of at least one of the illumination system and the projection objective, and
wherein the sequence of filters compensates for the transmission profile error.

37. The projection exposure apparatus as claimed in claim 36, wherein the correction element consists essentially of a first filter in the field region of at least one of the illumination system and the projection system, a second filter in the pupil region of at least one of the illumination system and the projection system, and a third filter in the intermediate region that is in neither the field region nor the pupil region.

38. The projection exposure apparatus as claimed in claim 37, wherein the first filter, the second filter and the third filter each has a quadratic profile.

39. The projection exposure apparatus as claimed in claim 37,
  wherein the at least one of the illumination system and the projection system defines an applicable system;
  wherein the first filter located in the field region of the applicable system is positioned to satisfy a condition $h_a/h_h < \tau$, and
  wherein the second filter located in the pupil region of the applicable system is positioned to satisfy a condition $h_a/h_h > 1/\tau$,
  where $h_a$=the maximum height of an aperture ray proceeding from a point of intersection between the optical axis of the applicable system and the object plane of the applicable system,
  where $h_h$=the height of the principle ray from an outermost field point of the object plane of the applicable system, and
  where $\tau=0.2$.

40. The projection exposure apparatus as claimed in claim 36, wherein the at least three filters are each positioned physically and optically separate from the optically effective element.

41. A projection exposure apparatus comprising an illumination system and a projection objective,
  the projection objective comprising an optically effective element whose maximum normalized intensity difference $\Delta I$ is more than 1%, which causes a transmission profile error,
  wherein at least one of the illumination system and the projection objective comprises a correction element for correcting the transmission profile error, and
  wherein the correction element:
    is spaced apart from the optically effective element and consists essentially of a sequence of at least three filters located in a sequence of locations, the locations comprising a field region, a pupil region and an intermediate region that is intermediate between the field region and the pupil region, of at least one of the illumination system and the projection objective, and
  wherein the sequence of filters compensates for the transmission profile error.

42. The projection exposure apparatus as claimed in claim 41, wherein an absorption constant K influencing the maximum normalized intensity difference $\Delta I$ is measured.

43. The projection exposure apparatus as claimed in claim 41, wherein the correction element consists essentially of a first filter in the field region of at least one of the illumination system and the projection system, a second filter in the pupil region of at least one of the illumination system and the projection system, and a third filter in the intermediate region that is in neither the field region nor the pupil region.

44. The projection exposure apparatus as claimed in claim 43,
  wherein the at least one of the illumination system and the projection system defines an applicable system;
  wherein the first filter located in the field region of the applicable system is positioned to satisfy a condition $h_a/h_h < \tau$, and
  wherein the second filter located in the pupil region of the applicable system is positioned to satisfy a condition $h_a/h_h > 1/\tau$,
  where $h_a$=the maximum height of an aperture ray proceeding from a point of intersection between the optical axis of the applicable system and the object plane of the applicable system,
  where $h_h$=the height of the principle ray from an outermost field point of the object plane of the applicable system, and
  where $\tau=0.2$.

45. The projection exposure apparatus as claimed in claim 41, wherein the at least filters are each positioned physically and optically separate from the optically effective element.

* * * * *